(12) United States Patent
Gautam et al.

(10) Patent No.: US 11,860,528 B2
(45) Date of Patent: Jan. 2, 2024

(54) MULTI-CHAMBER SUBSTRATE PROCESSING PLATFORM

(71) Applicant: Applied Materials, Inc., Santa Clara, CA (US)

(72) Inventors: Ribhu Gautam, Singapore (SG); Vibhu Jindal, San Jose, CA (US); Sanjay Bhat, Singapore (SG); Praveen Kumar Choragudi, Andhra Pradesh (IN); Vinodh Ramachandran, Singapore (SG); Arun Rengaraj, Karnataka (IN)

(73) Assignee: Applied Materials, Inc., Santa Clara, CA (US)

( * ) Notice: Subject to any disclaimer, the term of this patent is extended or adjusted under 35 U.S.C. 154(b) by 335 days.

(21) Appl. No.: 17/129,077

(22) Filed: Dec. 21, 2020

(65) Prior Publication Data

US 2022/0197128 A1 Jun. 23, 2022

(51) Int. Cl.

| | | |
|---|---|---|
| *H01L 21/67* | (2006.01) | |
| *G03F 1/24* | (2012.01) | |
| *H01L 21/687* | (2006.01) | |
| *B65G 47/90* | (2006.01) | |
| *C23C 14/06* | (2006.01) | |

(Continued)

(52) U.S. Cl.
CPC .............. *G03F 1/24* (2013.01); *B65G 47/90* (2013.01); *C23C 14/0641* (2013.01); *C23C 14/35* (2013.01); *C23C 14/566* (2013.01); *C23C 14/568* (2013.01); *C23C 14/5806* (2013.01); *H01L 21/67167* (2013.01); *H01L 21/67196* (2013.01); *H01L 21/67201* (2013.01); *H01L 21/67207* (2013.01); *H01L 21/68707* (2013.01); *H01L 21/68742* (2013.01); *H01L 21/68764* (2013.01)

(58) Field of Classification Search
CPC ....... G03F 1/24; B65G 47/90; C23C 14/0641; C23C 14/35; C23C 14/566; C23C 14/568; C23C 14/5806; H01L 21/67167; H01L 21/67196; H01L 21/67201; H01L 21/67207; H01L 21/68707; H01L 21/68742; H01L 21/68764; H01L 21/67126; H01L 21/67225; H01L 21/67718; H01L 21/67742; H01L 21/67745; H01L 21/67184
USPC .................. 204/298.01–298.41; 118/719
See application file for complete search history.

(56) References Cited

U.S. PATENT DOCUMENTS

| | | | |
|---|---|---|---|
| 5,421,889 A | 6/1995 | Pollock et al. | |
| 2013/0277207 A1* | 10/2013 | Tsunekawa | C23C 14/34 204/298.25 |

(Continued)

OTHER PUBLICATIONS

PCT International Search Report and Written Opinion in PCT/US2021/063754 dated Apr. 12, 2022, 11 pages.

*Primary Examiner* — Rodney G McDonald
(74) *Attorney, Agent, or Firm* — Servilla Whitney LLC

(57) ABSTRACT

Substrate processing systems or platforms and methods configured to process substrates including of extreme ultra-violet (EUV) mask blanks are disclosed. Systems or platforms provide a small footprint, high throughput of substrates and minimize defect generation. The substrate processing system platform comprises a single central transfer chamber, a single transfer robot, a substrate flipping fixture, and processing chambers are positioned around the single central transfer chamber.

10 Claims, 11 Drawing Sheets

(51) Int. Cl.
  *C23C 14/56* (2006.01)
  *C23C 14/58* (2006.01)
  *C23C 14/35* (2006.01)

(56) References Cited

U.S. PATENT DOCUMENTS

| | | | |
|---|---|---|---|
| 2018/0174873 A1* | 6/2018 | Miller | C23C 16/06 |
| 2019/0189499 A1* | 6/2019 | Strassner | H01L 21/68785 |
| 2020/0024726 A1* | 1/2020 | Moradian | H01L 21/67748 |
| 2020/0266039 A1 | 8/2020 | Bhat et al. | |

* cited by examiner

MULTI-CHAMBER SUBSTRATE PROCESSING PLATFORM

TECHNICAL FIELD

The present disclosure relates generally to multi-chamber substrate processing platforms. In particular, specific embodiments of the present disclosure relate to a single substrate processing platform comprising multiple substrate processing chambers and two load lock chambers configured to process a variety substrates such as EUV mask blanks and 300 mm wafers with low defects and high throughput and having a small footprint.

BACKGROUND

Extreme ultraviolet (EUV) lithography, also known as soft x-ray projection lithography, is used for the manufacture of 0.0135 micron and smaller minimum feature size semiconductor devices. Extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor substrate.

The lens elements and mask blanks of extreme ultraviolet lithography systems are coated with reflective multilayer coatings of materials such as molybdenum and silicon on a substrate having very low thermal expansion, for example, ultra low thermal expansion glass (e.g., ULE® glass available from Corning, Inc. or Zerodur® low expansion lithium aluminosilicate glass). Reflection values of approximately 65% per lens element, or mask blank, have been obtained by using substrates that are coated with multilayer coatings that strongly reflect light within an extremely narrow ultraviolet bandpass, for example, 12.5 to 14.5 nanometer bandpass for 13.5 nanometer ultraviolet light. Multiple different layers are deposited on the mask blanks in different processing chambers, including on a front side of a substrate at least planarization layer, reflective multilayer pairs, a capping layer, and an absorber layer, and a backside layer of a material such as chromium nitride. Multiple chambers are generally used to deposit the layers.

EUV mask blanks have a low tolerance for defects on the working area of the mask blank. A flat, smooth and defect-free surface of the substrate (e.g., ultra low thermal expansion glass) is needed for fabrication of defect-free extreme ultraviolet mask blanks. Conventional EUV mask blank manufacture in the current substrate processing system or platform requires multiple robotic handlers and manual hand-offs of substrates to move the mask blank to and from the various chambers of a substrate processing system or platform to deposit the various layers, resulting in higher defects and lower yield. Multiple chamber (or tool) requirements to complete deposition and anneal (e.g. reflective multilayer pairs, capping layer, absorber layer, and a backside coating) also leads to a high footprint and operational cost for the substrate processing system or platform. The existing central robot designed for 300 mm substrates causes high defect counts when used to process much heavier EUV substrates such as EUV mask blanks. In addition, the current slit valve, which opens and closes as substrates are introduced into the substrate processing chamber or system, generates an unacceptably high number of defects for the manufacture of EUV mask blanks.

Therefore, there is a need for a multi-chamber substrate processing system or platform configured to process EUV mask blanks, the system or platform having a smaller profile, less robotic handlers and manual hand-offs of the mask blanks to reduce defects.

SUMMARY

One or more embodiments of the disclosure are directed a substrate processing platform comprising a single central transfer chamber including a central robot hub having five substrate processing chambers surrounding the central transfer chamber, the central transfer chamber and the five substrate processing chambers being under vacuum conditions, the five substrate processing chambers comprising at least two multi-cathode physical vapor deposition (PVD) chambers and at least one substrate annealing chamber, and at least a first single cathode PVD chamber; a central robot disposed in the single central transfer chamber, the central robot configured to load and unload the substrate from the five substrate processing chambers; a factory interface disposed between the substrate processing chambers and an ambient factory environment; a substrate flipping fixture disposed within the factory interface and configured to rotate the substrate having the front side and the back side 180 degrees such that material can be deposited on both the front side and the back side of the substrate in one of the five substrate processing chambers; and a factory interface robot configured to load substrates from the ambient factory environment into the factory interface and onto the substrate flipping fixture.

Another aspect of the disclosure pertains to a method of processing an EUV mask blank substrate in a substrate processing platform, the method comprising using a factory interface robot to remove the EUV mask blank substrate from a factory interface and transfer the EUV mask blank substrate to a first load lock chamber; using a central robot to transfer the EUV mask blank from the first load lock chamber through a single central transfer chamber and to a first multi-cathode PVD chamber; depositing a reflective multilayer stack comprising a plurality of bilayer pairs on a front side of the EUV mask blank substrate in the first multi-cathode PVD chamber; utilizing the central robot to transfer the EUV mask blank substrate to one of a second multi-cathode PVD chamber and a single cathode PVD chamber; depositing an absorber layer on the front side of the EUV mask blank substrate after depositing the reflective multilayer stack in one of the second multi-cathode PVD chamber and the single cathode PVD chamber; annealing the EUV mask blank substrate in a first substrate annealing chamber; utilizing the central robot to transfer the EUV mask blank substrate to the first load lock chamber or a second load lock chamber; utilizing the factory interface robot to transfer the EUV mask blank substrate after annealing from the first load lock chamber or the second load lock chamber back to the factory interface; utilizing a substrate flipping fixture positioned in the factory interface to rotate the substrate 180 degrees so that the front side is facing downward; utilizing the factory interface robot to transfer the EUV mask blank to the first load lock chamber or the second load lock chamber; utilizing the central robot to transfer the EUV mask blank with the front side facing downward and a backside facing upward from the first load lock chamber or the second load lock chamber through the single central transfer chamber and to one of the single cathode PVD chamber, the second multi-cathode PVD chamber or a third multi-cathode PVD chamber; and depositing a backside layer on a back side of the EUV mask blank substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that reacts with the substrate surface.

Those skilled in the art will understand that the use of ordinals such as "first" and "second" to describe process regions do not imply a specific location within the processing chamber, or order of exposure within the processing chamber.

As used in this specification and the appended claims, the term "substrate" refers to a surface, or portion of a surface, upon which a process acts. It will also be understood by those skilled in the art that reference to a substrate is to only a portion of the substrate, unless the context clearly indicates otherwise. Additionally, in some embodiments, reference to depositing on a substrate includes depositing on both a bare substrate and a substrate with one or more films or features deposited or formed thereon. In specific embodiments, a substrate is an EUV mask blank or an EUV mask blank. Thus, the phrases "EUV mask blank" and "EUV reticle blank" may refer to a surface, or portion of a surface of an EUV mask blank or EUV reticle blank, upon which a process acts. In some embodiments, reference to depositing on an EUV mask blank or EUV reticle blank includes depositing on both a bare UV mask blank or EUV reticle blank and an UV mask blank or EUV reticle blank with one or more films or features deposited or formed thereon.

Figure 1:
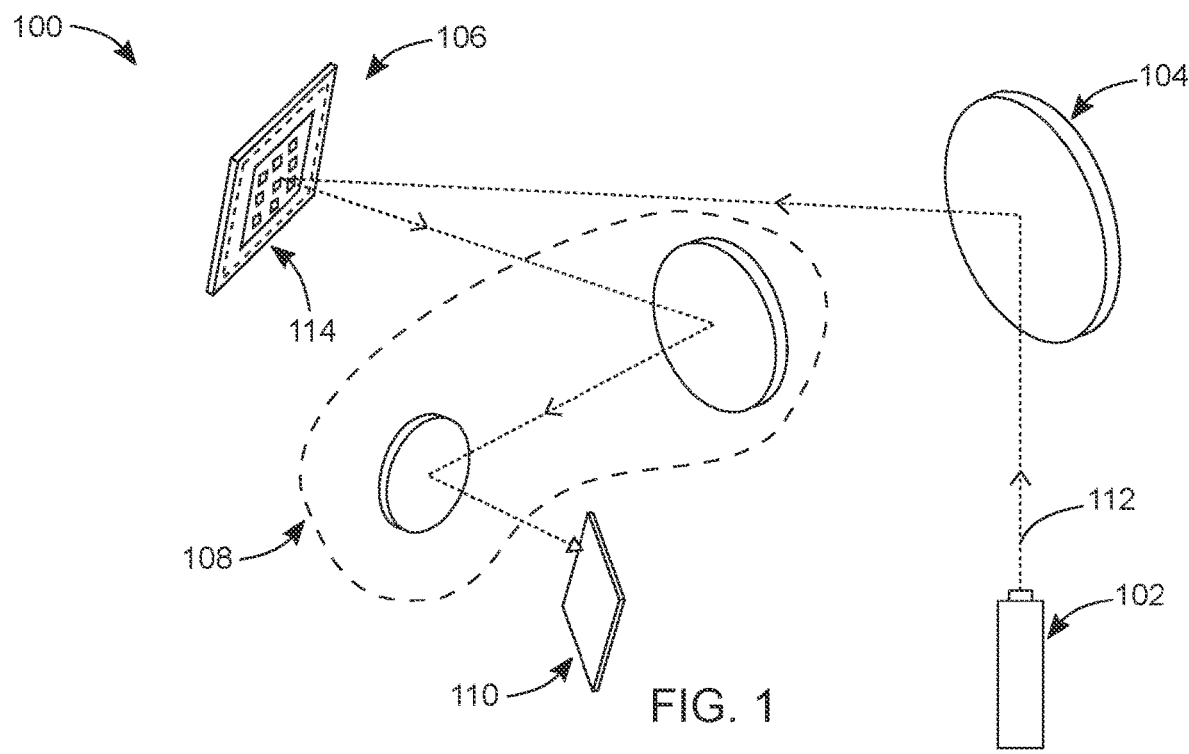
FIG. 1 schematically illustrates an embodiment of an extreme ultraviolet lithography system.

Referring now to FIG. 1, an exemplary embodiment of an extreme ultraviolet lithography system 100 is shown. The extreme ultraviolet lithography system 100 includes an extreme ultraviolet light source 102 for producing extreme ultraviolet light 112, a set of reflective elements, and a target substrate 110. The reflective elements include a condenser 104, an EUV reflective mask 106, an optical reduction assembly 108, a mask blank, a mirror, or a combination thereof.

The extreme ultraviolet light source 102 generates the extreme ultraviolet light 112. The extreme ultraviolet light 112 is electromagnetic radiation having a wavelength in a range of 5 to 50 nanometers (nm). For example, the extreme ultraviolet light source 102 includes a laser, a laser produced plasma, a discharge produced plasma, a free-electron laser, synchrotron radiation, or a combination thereof.

The extreme ultraviolet light source 102 generates the extreme ultraviolet light 112 having a variety of characteristics. The extreme ultraviolet light source 102 produces broadband extreme ultraviolet radiation over a range of wavelengths. For example, the extreme ultraviolet light source 102 generates the extreme ultraviolet light 112 having wavelengths ranging from 5 to 50 nm, from 10 to 25 nm, from 12.5 nm to 14.5 nm, for example 13.5 nm.

In one or more embodiments, the extreme ultraviolet light source 102 produces the extreme ultraviolet light 112 having a narrow bandwidth. For example, the extreme ultraviolet light source 102 generates the extreme ultraviolet light 112 at 13.5 nm. The center of the wavelength peak is 13.5 nm.

The condenser 104 is an optical unit for reflecting and focusing the extreme ultraviolet light 112. The condenser 104 reflects and concentrates the extreme ultraviolet light 112 from the extreme ultraviolet light source 102 to illuminate the EUV reflective mask 106.

Although the condenser 104 is shown as a single element, it is understood that the condenser 104 of some embodiments includes one or more reflective elements such as concave mirrors, convex mirrors, flat mirrors, or a combination thereof, for reflecting and concentrating the extreme ultraviolet light 112. For example, the condenser 104 of some embodiments is a single concave mirror or an optical assembly having convex, concave, and flat optical elements.

The EUV reflective mask 106 is an extreme ultraviolet reflective element having a mask pattern 114. The EUV reflective mask 106 creates a lithographic pattern to form a circuitry layout to be formed on the target substrate 110. The EUV reflective mask 106 reflects the extreme ultraviolet light 112. The mask pattern 114 defines a portion of a circuitry layout.

The optical reduction assembly 108 is an optical unit for reducing the image of the mask pattern 114. The reflection of the extreme ultraviolet light 112 from the EUV reflective mask 106 is reduced by the optical reduction assembly 108 and reflected on to the target substrate 110. The optical reduction assembly 108 of some embodiments includes mirrors and other optical elements to reduce the size of the image of the mask pattern 114. For example, the optical reduction assembly 108 of some embodiments includes concave mirrors for reflecting and focusing the extreme ultraviolet light 112.

The optical reduction assembly 108 reduces the size of the image of the mask pattern 114 on the target substrate 110. For example, the mask pattern 114 of some embodiments is imaged at a 4:1 ratio by the optical reduction assembly 108 on the target substrate 110 to form the circuitry represented by the mask pattern 114 on the target substrate 110. The extreme ultraviolet light 112 of some embodiments scans the reflective mask 106 synchronously with the target substrate 110 to form the mask pattern 114 on the target substrate 110.

Figure 2:
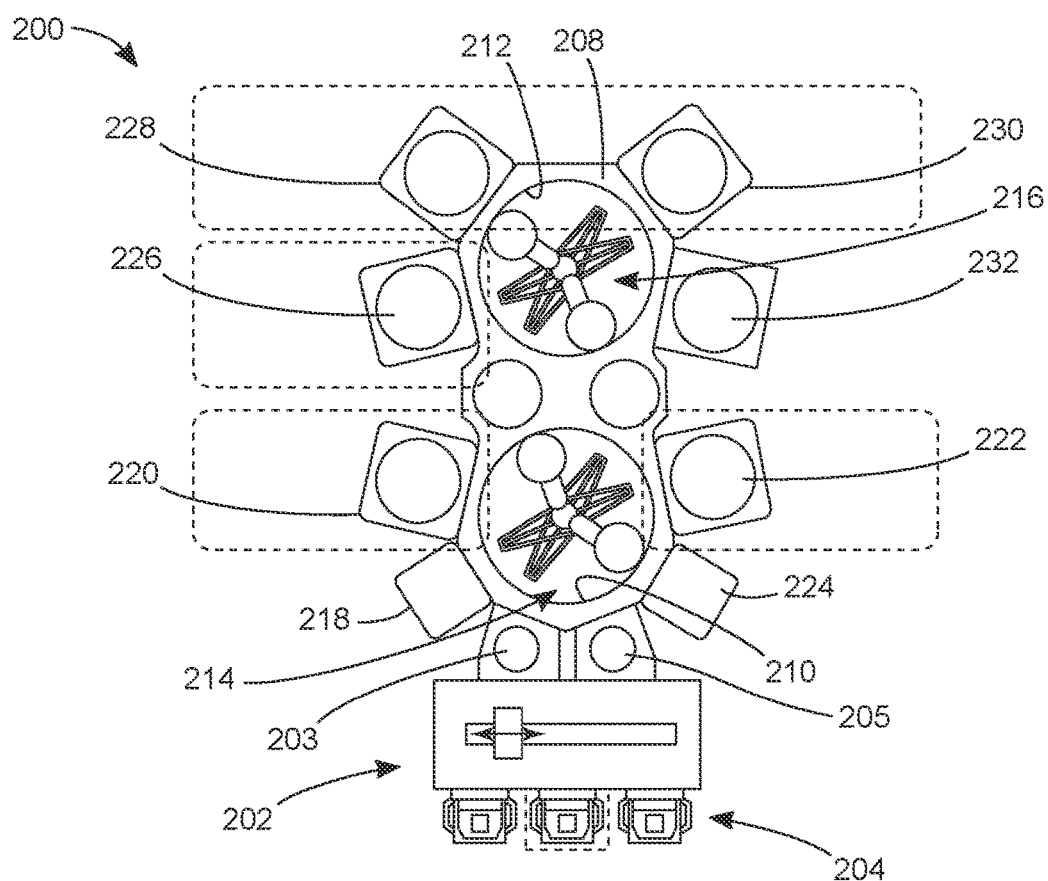
FIG. 2 schematically illustrates a top plan view of a conventional EUV mask blank processing platform.

Referring now to FIG. 2, an embodiment of a conventional substrate processing platform 200 is shown. The conventional substrate or EUV mask blank processing platform 200 includes a factory interface 202 into which the source substrates 203, 205 are loaded and from which substrates that have been processed in the EUV mask blank processing platform 200. Adjacent the factory interface 202 are substrate transport boxes 204 and other components to transfer a substrate from an ambient factory environment outside the substrate processing platform 200 to vacuum inside the substrate processing platform 200. The factory interface is within an enclosure that is under slight vacuum pressure to keep the factory interface in a controlled environment. The ambient factory environment is outside the factory interface.

The substrate handling vacuum chamber 208 contains two vacuum chambers, a first vacuum chamber 210 and a second vacuum chamber 212. The first vacuum chamber 210 includes a first substrate handling system 214 and the second vacuum chamber 212 includes a second substrate handling system 216.

The substrate handling vacuum chamber 208 has a plurality of ports around its periphery for attachment of various other systems. The first vacuum chamber 210 has a degas system 218, a first physical vapor deposition system 220, a second physical vapor deposition system 222, and a pre-clean system 224. The degas system 218 is for thermally desorbing moisture from the substrates. The pre-clean system 224 is for cleaning the surfaces of the substrates, mask blanks, mirrors, or other optical components.

The physical vapor deposition systems, such as the first physical vapor deposition system 220 and the second physical vapor deposition system 222, are used to form thin films of conductive materials on the source substrates 203. For example, the physical vapor deposition systems include vacuum deposition system such as magnetron sputtering systems, ion sputtering systems, pulsed laser deposition, cathode arc deposition, or a combination thereof. The physical vapor deposition systems, such as the magnetron sputtering system, form thin layers on the source substrates 203 including the layers of silicon, metals, alloys, compounds, or a combination thereof.

The physical vapor deposition system forms reflective layers, capping layers, and absorber layers. For example, the physical vapor deposition systems form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds include oxides, dioxides, atomic mixtures having oxygen atoms, or a combination thereof.

The second vacuum chamber 212 has a first multi-cathode source 226, a chemical vapor deposition system 228, a cure chamber 230, and an ultra-smooth deposition chamber 232 connected to it. For example, the chemical vapor deposition system 228 includes a flowable chemical vapor deposition system (FCVD), a plasma assisted chemical vapor deposition system (CVD), an aerosol assisted CVD, a hot filament CVD system, or a similar system. In another example, the chemical vapor deposition system 228, the cure chamber 230, and the ultra-smooth deposition chamber 232 are in a separate system from the conventional EUV mask blank processing platform 200.

The chemical vapor deposition system 228 forms thin films of material on the source substrates 203. For example, the chemical vapor deposition system 228 is used to form layers of materials on the source substrates 203 including mono-crystalline layers, polycrystalline layers, amorphous layers, epitaxial layers, or a combination thereof. The chemical vapor deposition system 228 of some embodiments forms layers of silicon, silicon oxides, silicon oxycarbide, carbon, tungsten, silicon carbide, silicon nitride, titanium nitride, metals, alloys, and other materials suitable for chemical vapor deposition. For example, the chemical vapor deposition system forms planarization layers.

The first substrate handling system 214 is capable of moving the source substrates 203 between an atmospheric handling system and the various systems around the periphery of the first vacuum chamber 210 in a continuous vacuum. The second substrate handling system 216 is capable of moving the source substrates 203 around the second vacuum chamber 212 while maintaining the source substrates 203 in a continuous vacuum. The conventional EUV mask blank processing platform 200 transfers the source substrates 203 between the first substrate handling system 214, the second substrate handling system 216 in a continuous vacuum.

A challenge in the manufacture of substrates that are processed in a manner that there are material layers deposited on both sides, for example, EUV mask blanks, in a multi-chamber substrate processing platform is to achieve the deposition and anneal of multiple layers with minimal particulate defects. One or more embodiments of the instant disclosure provide a multi-chamber substrate processing platform or system to deposit all layers of substrates such as EUV mask blanks in one contained system with minimal robotic transfers, a high payload robot, a slit valve design to reduce defects, and a substrate flipping fixtures in a factory interface to enable in-situ deposition on of both sides of substrates such as EUV mask blanks.

The multi-chamber substrate processing platforms and methods described herein according to one or more embodiments accommodate the formation of a diverse number of layers such as, for example, reflective multilayer stacks comprising alternating bilayers, absorber layer(s), capping layers, and backside layers. In addition, multi-chamber substrate processing platforms and methods described herein according to one or more embodiments accommodate annealing chamber(s) and PVD chambers for the formation of advanced absorbers for both EUV mask blanks and conventional semiconductor wafers. One or more embodiments provide a multi-chamber substrate processing platform configured to manufacture EUV mask blanks with reduced defects, high yield and low cost. The multi-chamber substrate processing platform can manufacture an EUV mask blank with just two robotic transfers and one substrate flipping fixture to meet all deposition and anneal requirements of substrate processes that require anneal and coating on a front side and a back side of a substrate. In addition, the multi-chamber substrate processing platform can process various substrates differing in material type, weight and geometry (e.g., 300 mm wafers and 152 mm×152 mm ULE substrates for EUV mask blanks), and can incorporate a chamber required for next node of advanced absorber development.

EUV mask blanks comprise a high quality rectangular substrate (e.g., ultra low expansion glass) deposited with a mirror layer (40 Si/Mo bilayers), a capping layer (e.g, Ru), absorber layer(s) (e.g., TaN) on a front side of the substrate and a layer (e.g., CrN) on the backside of the substrate. In the current process, different tools are required to perform the steps to form these layers and anneal the substrates, which increases defect counts and lowers yield. Moreover, multiple different systems requiring a larger footprint provide an operational disadvantage. The multi-chamber substrate processing platform described herein provides a single system having a small footprint, low defect generation, and high yield.

One or more embodiments of the present disclosure advantageously provides a system or platform configured to manufacture a variety of substrates including EUV mask blanks and EUV reticle blanks with reduced defects. In some embodiments, EUV mask blanks are produced at higher yield and lower cost compared to production in conventional EUV mask blank processing platform. One or more of these advantages are achieved with a substrate processing system or platform such as an EUV mask blank processing system platform including two robotic transfers and one substrate flipping fixture to meet all deposition and anneal requirements. In specific embodiments, the substrate processing platform or system or EUV mask blank processing system or platform utilizes no more than two central robots, and in specific embodiments, a single central robot to effect robotic transfers. In one or more embodiments, the platform or system described herein comprise no more than one substrate flipping fixture to rotate the substrate, such as an EUV mask blank substrate during processing in the processing system or platform. Moreover, one or more embodiments of the substrate processing system or platform is capable of being configured to process various substrates differing in material type, weight and geometry (e.g., 300 mm wafers, 152 mm×152 mm EUV mask blanks comprising ultra low expansion substrates) and can incorporate chambers required for the next node of advanced EUV absorber development.

Furthermore, one or more embodiments of the present disclosure advantageously provides for a substrate processing system or platform configured to perform all deposition and anneal steps for EUV mask or EUV reticle development in one system, reducing defect generation on EUV masks or EUV reticles that are caused by multiple robotic transfers or manual transfer (e.g. tool-to-tool (or chamber-to-chamber)). In some embodiments, a high payload vacuum transfer design and vertical slit valve design reduce generation of defects, resulting in production of EUV masks and EUV reticles at high yields. In some embodiments, the substrate processing system or platform is configured for one or more of types of substrates, for example, conventional 300 mm wafers and EUV mask blank substrates and EUV reticle blanks.

Figure 3:
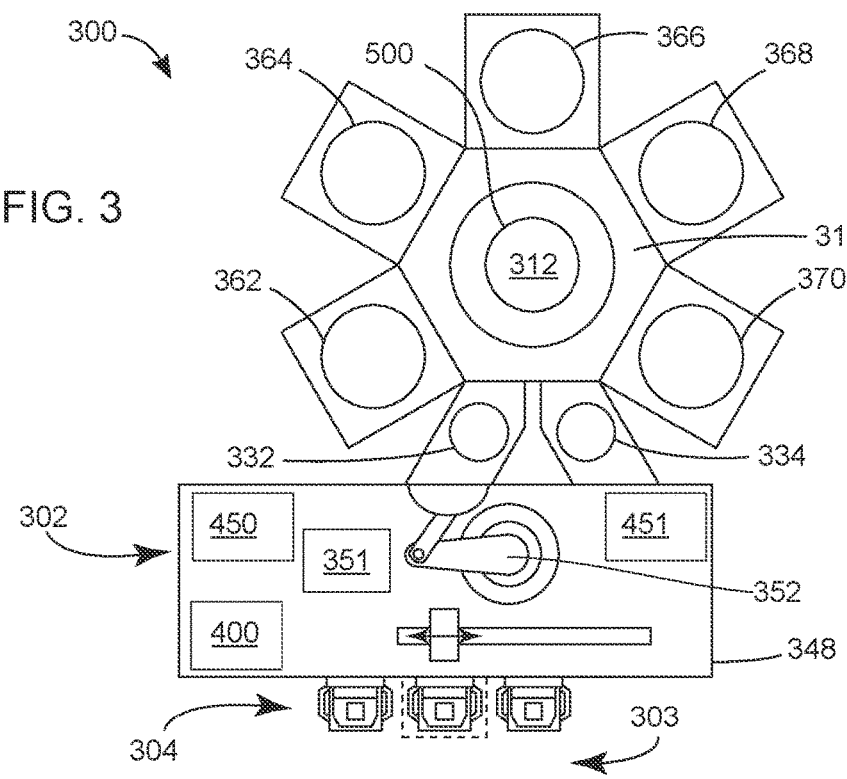
FIG. 3 illustrates a top plan view an embodiment of substrate processing platform according to an embodiment of the present disclosure.

As shown in FIG. 3, an embodiment of a substrate processing system or platform 300 comprises a central transfer chamber 310, which in some embodiments, is the only or sole or a single central transfer chamber 310 in the substrate processing system or platform 300. In other words, there is no more than one central transfer chamber 310, and the single central transfer chamber 310 comprises includes a single central robot 500 (shown in detail in FIGS. 10-14) mounted on a central robot hub 312. The central robot 500 disposed in the single central transfer chamber 310 is configured to load and unload a substrate from substrate processing chambers 362, 364, 366, 368 and 370. In the embodiment shown there are five substrate processing chambers, and as described in more detail herein, the substrate processing system or platform 300 includes no more than five substrate processing chambers.

The substrate processing system or platform 300 further comprises a factory interface 302 which is disposed between substrate processing chambers and an ambient factory environment 303 from which substrates are loaded. In one or more embodiments, the factory interface 302 is configured as a dual factory interface with a substrate flipping fixture 400, which as described further below, is configured to enable the substrate processing platform or system to allow for deposition on both sides of any substrate (e.g., a 300 mm diameter wafer and EUV mask blanks (e.g., 152 mm×152 mm mask blank)). In some embodiments, and as explained in further detail below, the single central robot 500 is configured to support a 1 kg payload, making it suitable to support and transfer EUV mask blank substrates, which are processed using an EUV mask blank carrier assembly including a carrier base and a top shield. The substrate flipping fixture 400 (described in more detail below) is disposed within the factory interface 302 and configured to rotate a substrate having a front side and a back side 180 degrees such that a layer can be deposited on both the front side and the back side of the substrate in one of the substrate processing chambers. The factory interface 302 further comprises a plurality of load ports 304 and one of the load ports may be configured to load one type of substrate, such as 300 mm wafers, while other of the load ports may be configured to load another type of substrate such as EUV mask blanks together with an EUV mask blank carrier assembly.

Between the factory interface 302 and the substrate processing chambers 362, 364, 366, 368 and 370 there is a first load lock chamber 332 and a second load lock chamber 334, which are under vacuum conditions. The factory interface is isolated from the ambient factory environment by an enclosure 348. The first load lock chamber 332 and the second load lock chamber 334 are positioned between the factory interface 302 and the central transfer chamber 310 and are configured to be an intermediate transfer space from the factory interface 302 to the substrate processing chambers 362, 364, 366, 368 and 370. The substrate flipping fixture 400, as explained in further detail below, is configured to flip or rotate substrates 180 degrees. There is a factory interface robot 352 configured to load substrates from the ambient factory environment 303 into the factory interface 302 and onto the substrate flipping fixture 400.

In some embodiments, the factory interface robot 352 is configured to transfer the substrate between the factory interface 302 and the first load lock chamber 332 and between the factory interface 302 and the second load lock chamber 334. The factory interface robot 352 is further configured in some embodiments to load and unload substrates to and from a first build module fixture 450 and a second build module fixture 451, which are utilized in the processing of EUV mask blank substrates and EUV mask blank carrier assemblies as described further with respect to FIG. 7.

The central transfer chamber 310 is configured as a substrate handling vacuum chamber through which all transfers between processing chambers 362, 364, 366, 368 and 370 occur, providing a platform having a small footprint and reduced robotic transfers by having a single central robot 500 for all transfers between the substrate processing chambers 362, 364, 366, 368 and 370 surrounding the central transfer chamber 310, which are all under vacuum conditions. The central transfer chamber 310 includes a centrally located central robot 500 (described further with respect to FIGS. 10-14) positioned on a central robot hub 312. As explained in further detail below, the central robot 500 is configured to load and transfer substrates along a predetermined path. In some embodiments, the central robot 500 is configured to load and transfer substrates in a clockwise path. In some embodiments, the central robot is configured to load and transfer substrates and in a counter-clockwise path. In some embodiments, the central robot 500 is configured to load and transfer substrates between the two or more processing chambers 362, 364, 366, 368 and 370.

The central transfer chamber 310 has a plurality of ports 380 (see FIG. 12) around its periphery in communication with each of the two or more processing chambers 362, 364, 366, 368 and 370 or components of various other systems. In some embodiments, the processing chambers 362, 364, 366, 368 and 370 include multi-cathode physical vapor deposition (PVD) chambers, substrate annealing chambers, degas chambers and pre-clean chambers. The degas chamber is for thermally desorbing moisture from the substrates and the pre-clean chamber is for cleaning the surfaces of the substrates. The two or more processing chambers 362, 364, 366, 368 and 370 are positioned around the periphery of the central transfer chamber 310.

As shown in FIG. 3, a first multi-cathode PVD chamber 362 is in communication with the central transfer chamber 310 and adjacent to the first load lock chamber 332. A first substrate annealing chamber 364 is in communication with the central transfer chamber and adjacent to the first multi-cathode PVD chamber 362. In some embodiments, a second multi-cathode PVD chamber 366 is positioned adjacent to the first substrate annealing chamber 364 and a second substrate annealing chamber 368 is positioned adjacent to the second multi-cathode PVD chamber 366. The second multi-cathode PVD chamber 366 and the second substrate annealing chamber 368 each are in communication with the central transfer chamber 310 through a port 380. In some embodiments, the second substrate annealing chamber 368 is adjacent to the second load lock chamber 334. In some embodiments, the second substrate annealing chamber 368 is adjacent to a third multi-cathode PVD chamber 370, the third multi-cathode PVD chamber in communication with the central transfer chamber 310 and positioned adjacent to the second load lock chamber 334.

In some embodiments, the one or more of the annealing chambers (364, 368) are a multi-substrate annealing chamber configured to anneal one or more substrates. In some embodiments, one or more of the multi-cathode PVD chambers (362, 366, 370) are a multi-cathode PVD chamber configured to deposit one or more different layers on one or more substrates. In some embodiments, one or more of the annealing chambers (364, 368) and one or more of the multi-cathode PVD chambers (362, 366, 370) comprise one or more regions with a substrate support surface configured to receive one or more substrates from the central robot 500. In some embodiments, the five substrate processing chambers 362, 364, 366, 368, 370 comprise at least two multi-cathode physical vapor deposition (PVD) chambers, a single cathode PVD chamber and at least one substrate annealing chamber, and at least a first multi-cathode PVD chamber configured to deposit different layers.

In some embodiments, the processing chambers 362, 364, 366, 368 include absorber (TaN), backside (CrN) and anneal chambers. In some embodiments, one or more of the multi-cathode PVD chambers (362, 366, 370) include an advanced absorber multi-cathode deposition chamber.

In some embodiments, the one or more of the multi-cathode PVD chambers (362, 366, 370) are configured as a PVD chamber which includes a plurality of cathode assemblies. The plurality of cathode assemblies positioned above shield holes of an upper shield. Each of the plurality of cathode assemblies are include one or more targets and are configured to deposit material from the one or more targets onto a reticle or substrate. In some embodiment, the PVD chamber is also provided with a rotating pedestal. In such embodiments, the PVD chamber is configured to alternately sputter material from the one or more targets without rotating the upper shield.

In some embodiments, the one or more targets comprise a molybdenum target and a silicon target. Plasma sputtering may be accomplished using either DC sputtering or RF sputtering in the PVD chamber. In some embodiments, the process chamber includes a feed structure for coupling RF and DC energy to the targets associated with each cathode assembly.

Figure 4:
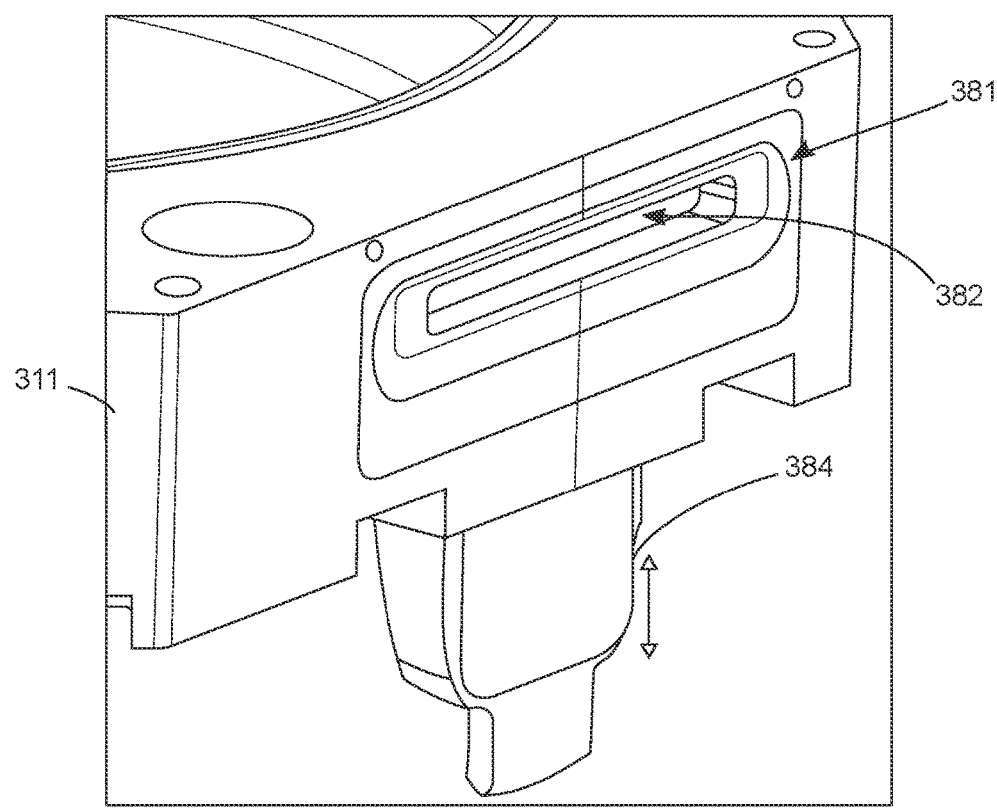
FIG. 4 illustrates a perspective view of the vertical slit valve of the substrate processing platform according to an embodiment of the present disclosure.
Figures 5, 6:
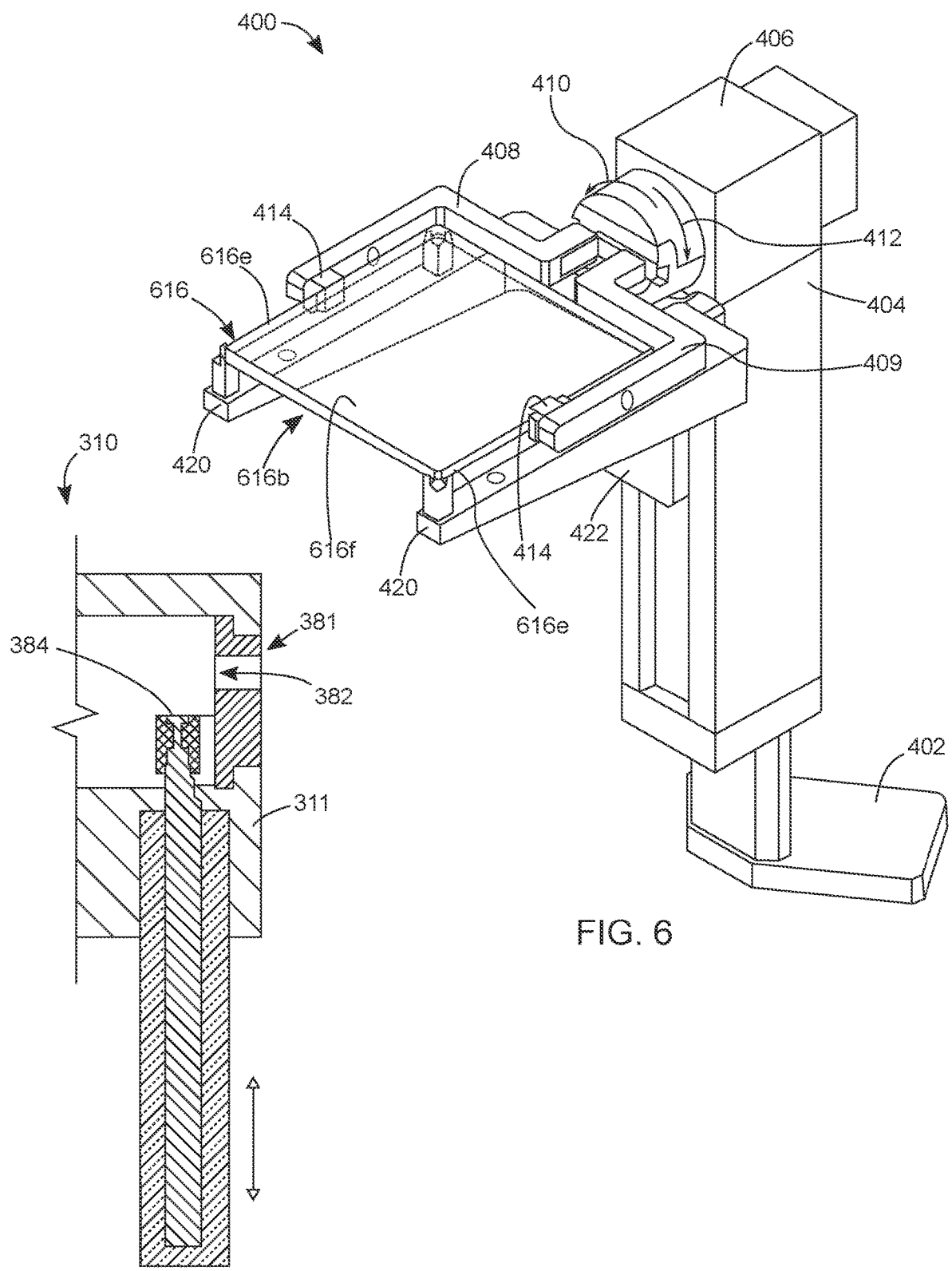
FIG. 5 illustrates a cross-sectional view of the vertical slit valve of the substrate processing platform according to an embodiment of the present disclosure.
FIG. 6 illustrates a perspective view of a substrate flipping fixture used with a substrate processing platform according to an embodiment of the present disclosure.

FIGS. 4 and 5 an exemplary embodiment of the port 380 that provides an interface between the central transfer chamber 310 and each of the substrate processing chambers 362, 364, 366, 368 and 370, and in the embodiments shown there is a port 380 for each of the substrate processing chamber. In the embodiment shown, the port 380 configured as a vertical slit valve 381. FIG. 4 illustrates a perspective view of the vertical slit valve 381 and FIG. 5 illustrates a cross-sectional view of the vertical slit valve 381. As shown in FIGS. 4 and 5, a chamber wall 311 of the central transfer chamber 310 has a vertical opening 382 through which a substrate passes through. As indicated by the arrow, a door 384 travels in a perpendicular direction relative to the vertical opening 382. Stated differently, the door 384 travels parallel to the chamber wall 311 of the central transfer chamber 310. Due to the door 384 traveling a shorter distance relative to conventional ports, less impact is created when the door 384 is fully closed, and thus particle generation is minimized.

FIG. 6 illustrates a perspective view of the substrate flipping fixture 400, which is positioned within the enclosure 348 of the factory interface 302. As previously described, a layer of material is deposited on a first side (e.g., a front side) of a substrate such as an EUV mask blank substrate in one of the substrate processing chamber 362, 364, 366, 368, 370, and then the substrate is removed by the central robot 500 to the central transfer chamber 310 and then to the factory interface 302 where the substrate flipped or rotated 180 degrees so that the front side faces downward and the bottom side faces upward.

Integration of a substrate flipping fixture 400 inside the factory interface 302 reduces unnecessary additional handling and transport of the substrate to a different system, which aids in reducing particles as every transfer of the transfer during transfer and processing is potential source of particle generation. In some embodiments, the substrate flipping fixture 400 is mounted above a build module fixture located within the factory interface 302.

The substrate flipping fixture 400 comprises a base 402 supporting a vertical slide 404 and a motor 406 positioned above the vertical slide 404. A pair of gripping elements 408, 409 are configured to grip edges 616e of the substrate 616 (e.g., and EUV mask blank) between the front side 616f and the backside 616b of the substrate. The gripping elements 408, 409 may be in the form of spaced apart arms as shown, which may be closed closer together to grip or hold the substrate 616 and opened further apart to release the substrate 616. The gripping elements 408, 409 may comprise gripping features, which may comprise blocks of material such as rubber or plastic. The gripping elements 408, 409 are configured to rotate 180 degrees in the direction of arrows 410, 412 driven by motor 406 to cause the front side 616f of the substrate 616 to rotate from a first position in which the front side 616f faces upward to a second position in which the front side 616f faces downward and the backside 616b faces upward.

The substrate flipping fixture 400 further comprises a moveable support fixture 422 including two support arms 420 spaced apart and configured to support the substrate 616 during substrate flipping or rotation process. The moveable support fixture 422 travels along the vertical slide 404 in an up and down direction, and in some embodiments is powered by motor 406. The operation cycle of the substrate flipping fixture is initiated when the substrate flipping fixture 400 receives substrate 616, which in the embodiment shown, is an EUV mask blank substrate from the factory interface robot 352, as described further below.

Figure 7:
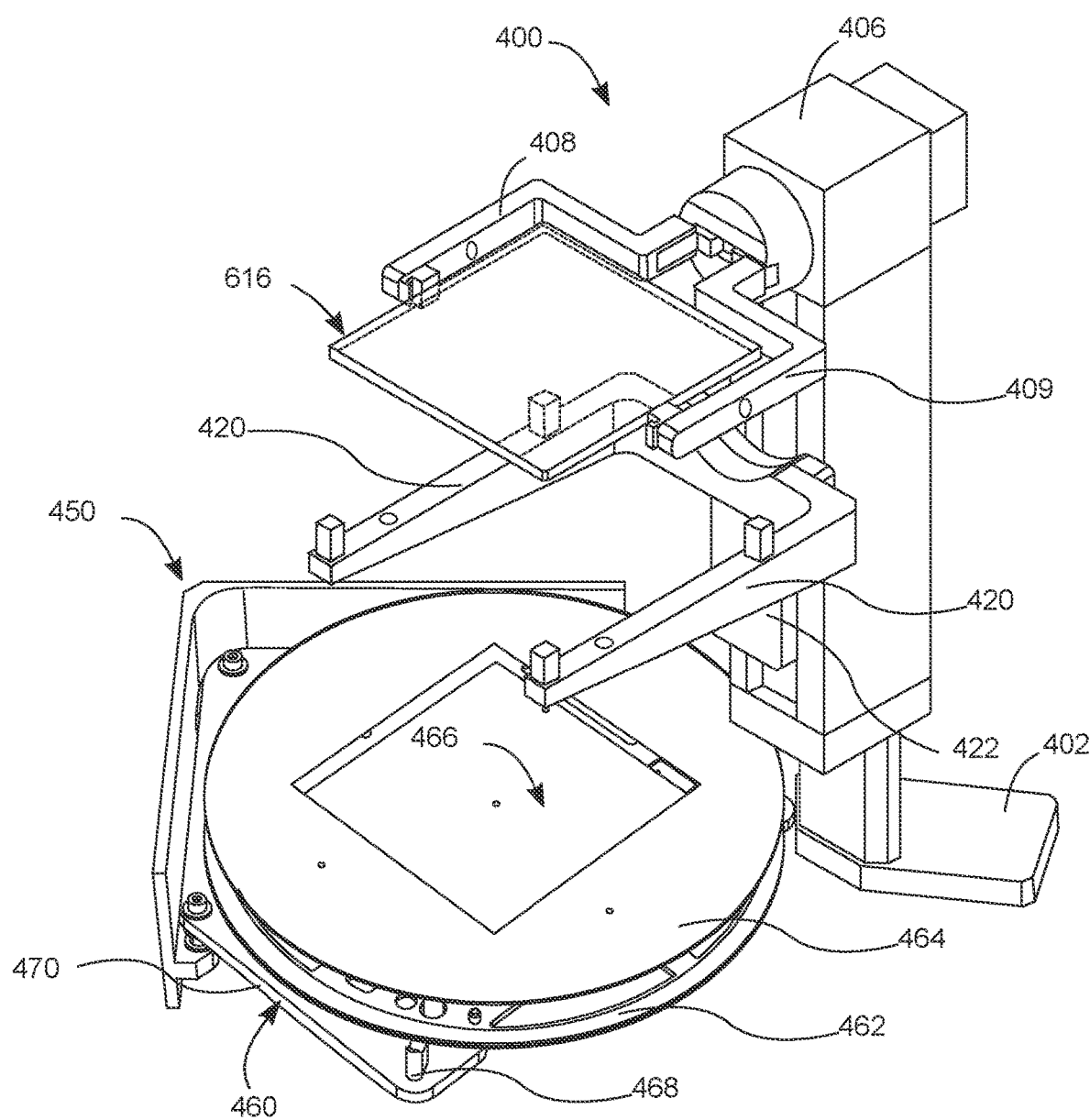
FIG. 7 illustrates a perspective view of a substrate flipping fixture for flipping a substrate according to an embodiment of the present disclosure.
Figure 8:
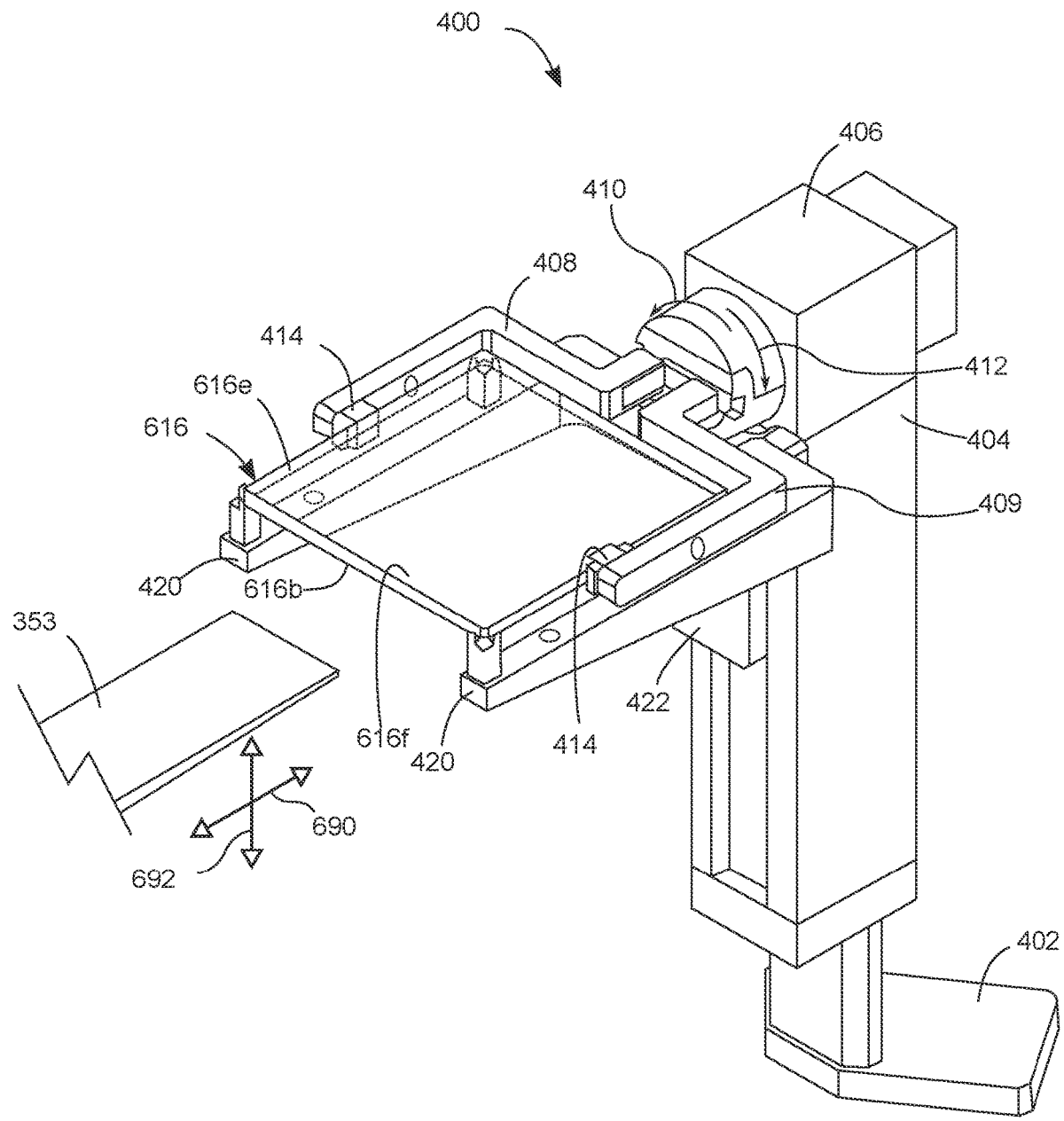
FIG. 8 illustrates a perspective view of a robot blade and a substrate flipping fixture for flipping a substrate according to an embodiment of the present disclosure.
Figure 9:
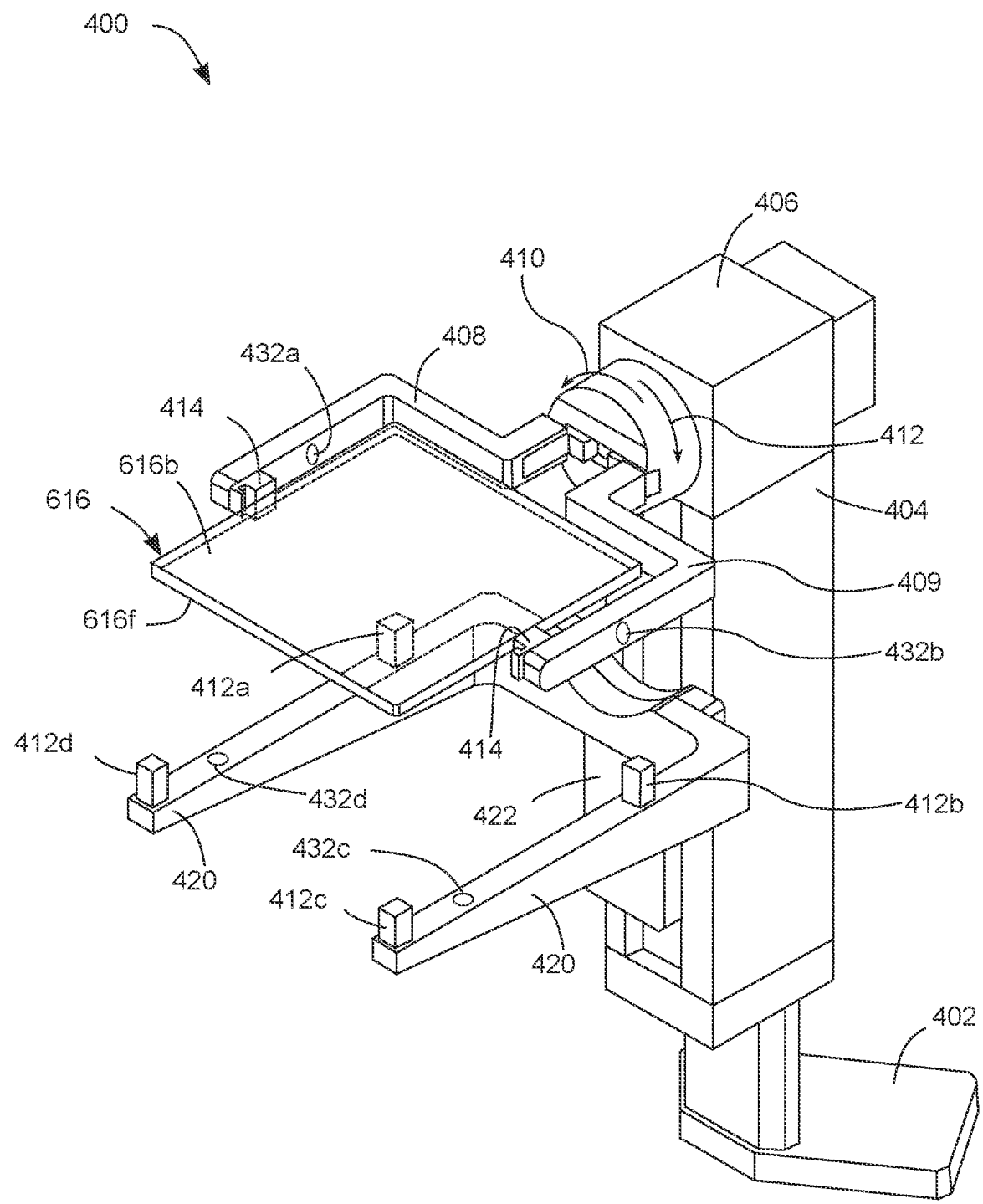
FIG. 9 illustrates a perspective view of the substrate flipping fixture for flipping a substrate according to an embodiment of the present disclosure in a raised position.
Figure 15:
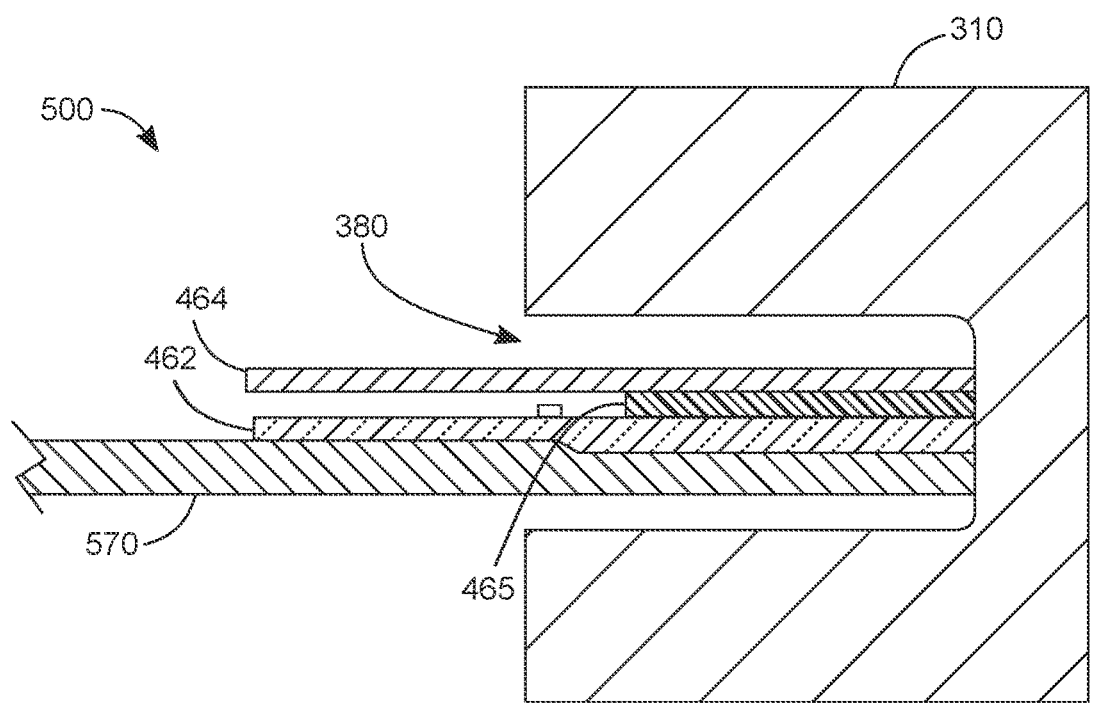
FIG. 15 illustrates a cross-sectional view of the robot blade of FIG. 11 partially inserted into one of the plurality of ports of the central transfer chamber according to an embodiment of the present disclosure.

Referring now to FIGS. 7-9, various stages of a substrate flipping or rotation process are shown. FIG. 7 illustrates a perspective view of a substrate flipping fixture 400 positioned adjacent the first build module fixture 450 in the factory interface 302. It will be appreciated that in FIG. 7, the first build module fixture 450 is shown in a position to better view the components of a mask blank carrier assembly 460 comprising a carrier base 462 and a top shield 464 having an opening 466 therein configured to receive an EUV mask blank substrate 465 as shown in FIG. 15 (e.g., an EUV mask blank having length×width dimensions of 152 mm×152 mm). The build module fixture 450 comprises a main support body 470 and a plurality of lift pins 468 (only one is visible in FIG. 7). The build module fixture 450 can be mounted a frame other suitable structure within the factory interface so that the build module fixture 450 is mounted in a position below the moveable support fixture 422. The lift pins 468 can be actuated by a pneumatic, hydraulic or motor (e.g., servo motor) actuator, which causes the top shield 464 to be lifted from the carrier base 462, exposing a substrate 616 supported by the EUV mask blank carrier assembly and contained within the opening. Lifting the cover top shield 464 exposes the substrate 616 so that the substrate can be accessed by a robot blade to move the substrate to the moveable support fixture 422 during a flipping or rotation process.

FIG. 8 illustrates a perspective view of a factory interface robot blade 353 attached to the factory interface robot 352 (of FIG. 3). The factory interface robot blade 353 is moveable up and down as indicated by arrow 692 and in the direction indicated by arrow 690 to allow the factory interface robot 352 to lift and lower the substrate 616 to the various components of the substrate flipping fixture 400, namely the moveable support fixture 422 and the pair of gripping elements 408 and 409. As shown in FIG. 8, the front side 616f of the substrate 616 is facing in the upward orientation and the backside 616b is facing in the downward orientation.

FIG. 9 illustrates the substrate flipping fixture 400 with the pair of gripping elements 408, 409 holding the substrate 616 in a raised position above the moveable support fixture 422 after the substrate show in FIG. 8 has been rotated 180 degrees. The backside 616b is now facing in an upward orientation and the front side 616f is facing in a downward orientation. The moveable support fixture 422 can now be moved closer to the pair of gripping elements 408, 409, and when the standoffs 412a, 412b, 412c, and 412d contact the substrate 616, the gripping elements 408, 409 are moved apart. Then, the factory interface robot blade 353 is used to remove the substrate and place the substrate back in one of load lock chambers 332 and 334. Next, the central robot 500 moves the substrate to a substrate processing chamber so that a material layer can be deposited on backside 616b of the substrate.

In operation, the factory interface robot 352 positions substrate 616 in the form an a EUV mask blank on standoffs 412a, 412b, 412c and 412d on the support arms 420 of the moveable support fixture 422 as shown in FIG. 8. The moveable support fixture 422 is then moved upward so that the pair of gripping elements 408, 409 are in position to grip the edges 616e of the substrate. The pair of gripping elements 408, 409 may be moved apart during the operation in which the moveable support fixture is moved closer to the pair of gripping elements 408, 409, and the pair of gripping elements 408, 409 can be moved closer together to grip the substrate 616 at edges 616e.

The gripping elements 408, 409 may each have gripping element sensors 432a, 432b, which communicate with the motor 406 to allow the motor to grip and release the substrate. The gripping element sensors 432a, 432b are in communication with a controller 351, which is configured to execute instructions to control operation of the substrate processing system or platform 300, including the central robot 500 and the factory interface robot 352. Support arm sensors 432c, 432d are also in communication with the controller to control upward and downward movement of the moveable support fixture 422.

FIGS. 10 through 15 illustrate an exemplary embodiment of a central robot 500. Conventional robotic arms used in semiconductor substrate processing chambers to handle 300 mm wafers are configured for one or more individual transfer tasks. Furthermore, conventional robotic arms are limited by the weight payload of the arm and the reach of the arm. Where greater payloads and arm reach are required in specific applications, premature wear of the robot, particle generation and droop can occur. The described central robot 500 advantageously provides for supporting loads of 1 kg with a reach of 39.5 inches while reducing droop and producing less particles and contaminants.

Figure 10:
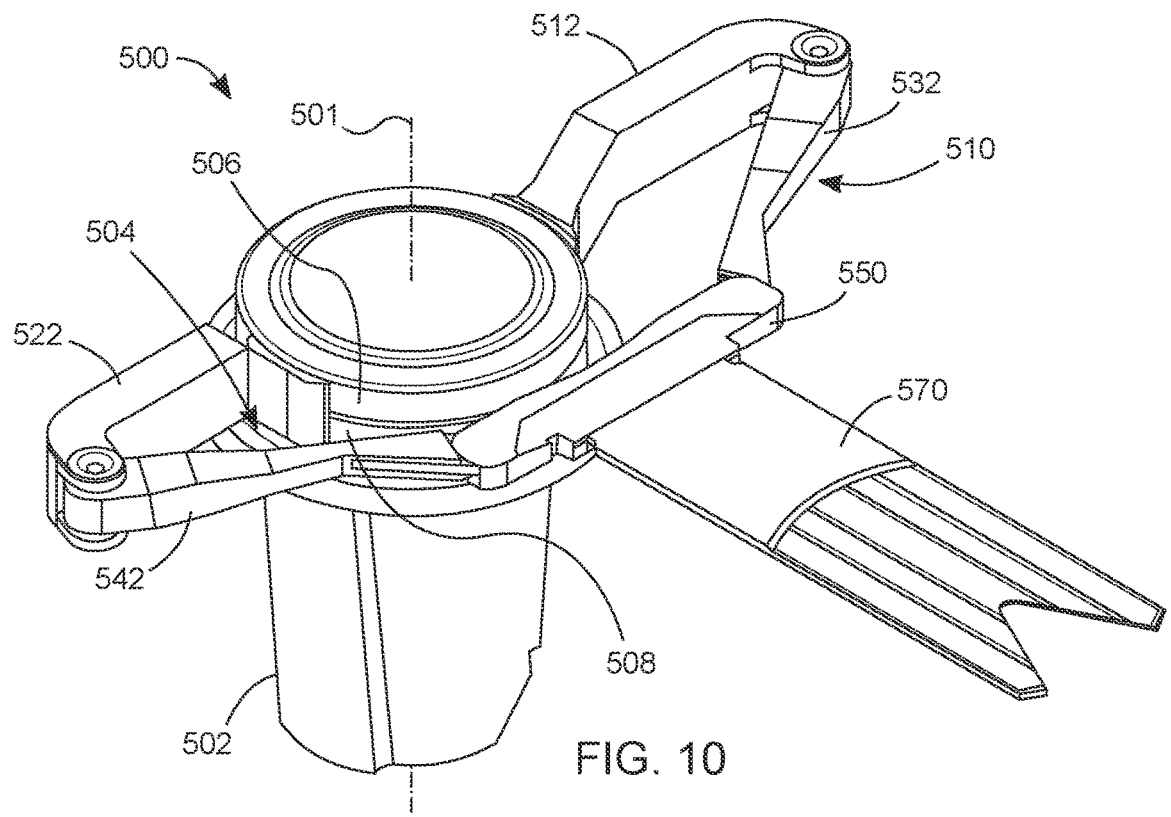
FIG. 10 illustrates a perspective view of a central robot used with a substrate processing platform according to an embodiment of the present disclosure.
Figure 11:
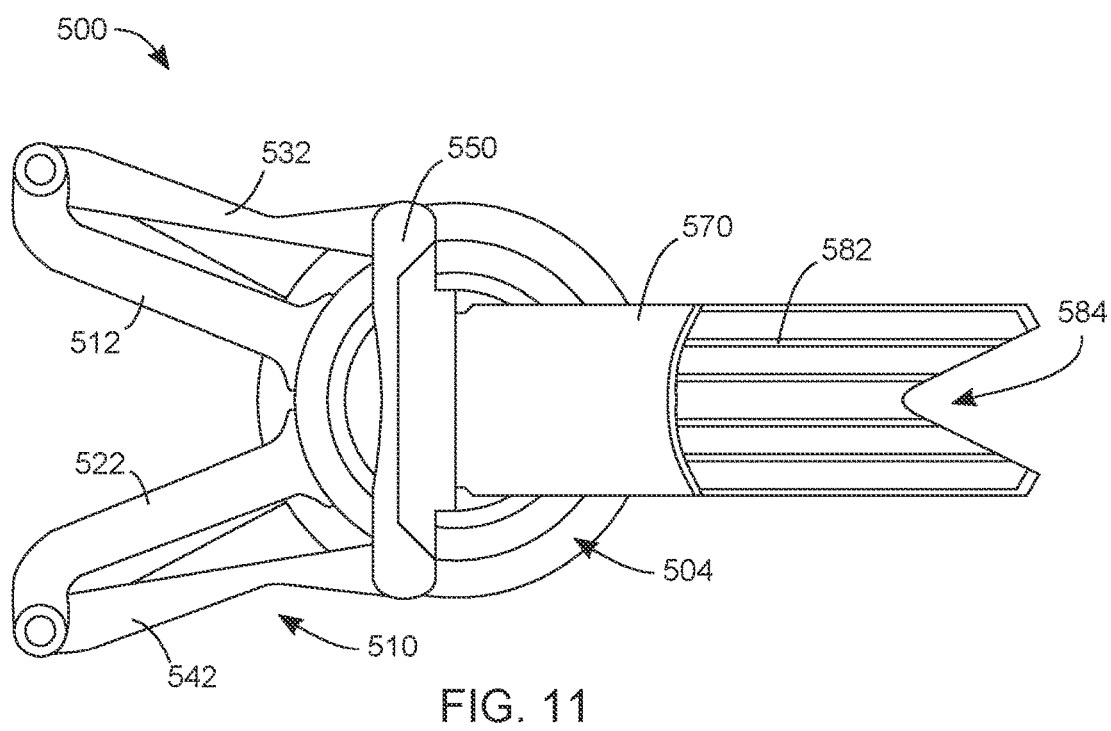
FIG. 11 illustrates a top view of a central robot used with substrate processing platform according to an embodiment of the present disclosure.

As previously described, the central transfer chamber 310 (of FIG. 3) includes a centrally located central robot 500 positioned on the central robot hub 312. FIG. 10 illustrates a perspective view of the central robot 500 and FIG. 11 illustrates a top view of the central robot 500. As shown in FIGS. 10 and 11, the central robot 500 comprises the central robot hub 312, a robot arm assembly 510, a base end effector 550 and a robot blade 570. The robot arm assembly extends and retracts in an x-y plane, the x-y plane traversing z-plane.

The central robot hub 312 has a substantially cylindrical body 502, a top surface 504, and a central axis 501 traversing the top surface 504 in a z-plane. The robot arm assembly 510 comprises a first arm 512, a second arm 522, a first linkage 532 and a second linkage 542. In some embodiments, the central robot hub 312 further comprises a first rotating disk 506 and a second rotating disk 508. The first rotating disk 506 adjacent to the top surface 504, and the second rotating disk 508 is adjacent to the first rotating disk 506. The first and second rotating disks (506, 508) are configured to rotate in opposite directions. The first rotating disk 506 has a thickness and an outside surface, and the second rotating disk 508 has a thickness and an outside surface. The central robot hub 312, first rotating disk 506 and second rotating disk 508 have a common center axis 501.

Figure 12:
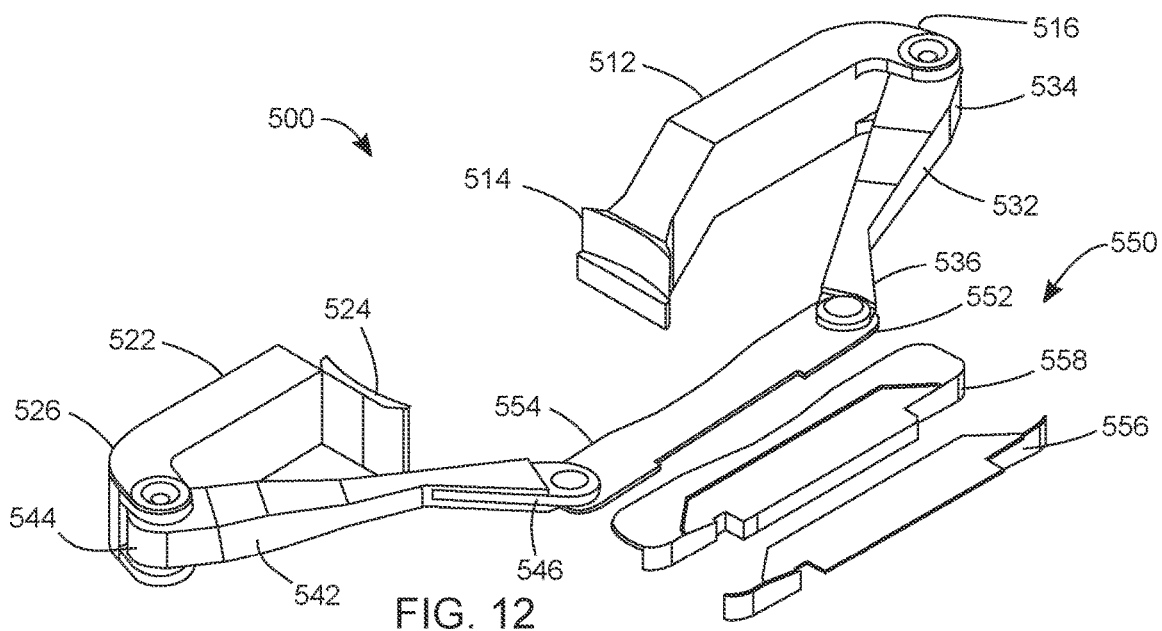
FIG. 12 illustrates a perspective view of a robot arm assembly of the central robot used with a substrate processing platform according to an embodiment of the present disclosure.

As shown in FIG. 12, the first arm 512 has a proximal end 514 and a distal end 516, the proximal end 514 mounted to the robot hub (not shown). As used herein, a proximal direction is defined by a position closest to the robot hub and a distal direction is defined by a position furthest from the robot hub. Likewise, the second arm 522 has a proximal end 524 and a distal end 526, the proximal end 524 mounted to the robot hub (not shown). The first linkage 532 has a proximal end 534 and a distal end 536, the proximal end 534 connected to the distal end 516 of the first arm 512. The second linkage 542 has a proximal end 544 and a distal end 546, the proximal end 544 connected to the distal end 526 of the second arm 522. In some embodiments, the proximal end 514 of the first arm 512 is mounted to the outside surface of the first rotating disk 506 and the proximal end 524 of the second arm 522 is mounted to the outside surface of the second rotating disk 508.

The base end effector assembly 550 has a medial end 552 and a lateral end 554. The medial end 552 connected to the distal end 536 of the first linkage 532 and the lateral end 554 connected to the distal end 546 of the second linkage 542. The distal portion 576 is configured to support a reticle or EUV mask blank substrate. In some embodiments, the base end effector 550 comprises a flexure plate 556 and a cover 558, the flexure plate and cover configured to secure the robot blade.

Figure 14:
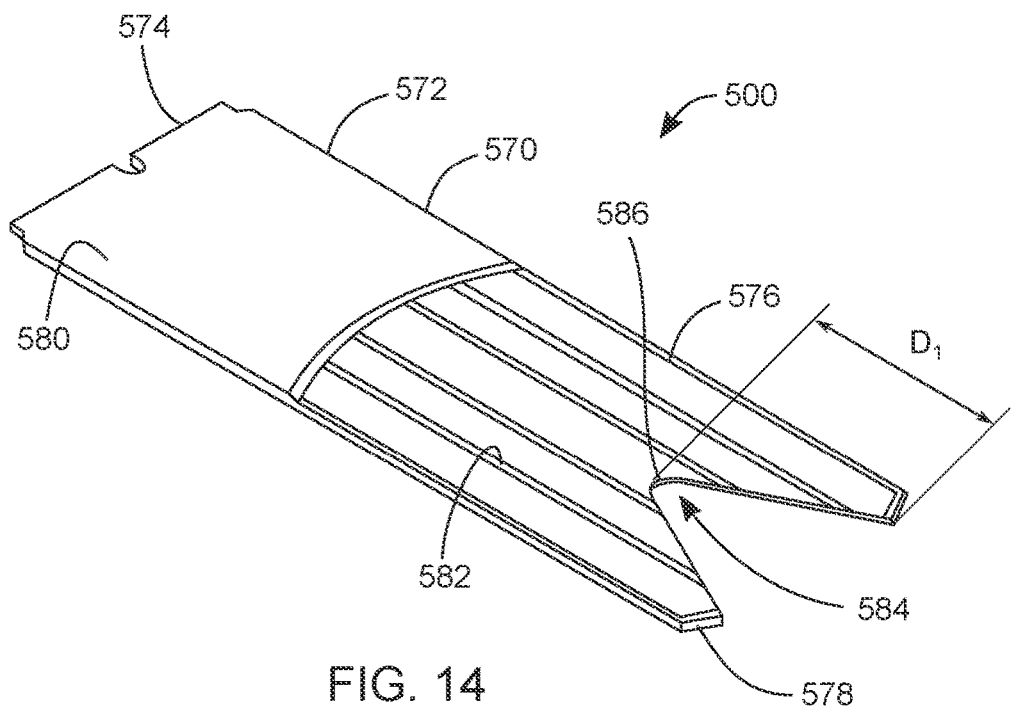
FIG. 14 illustrates a perspective view of a robot blade of the central robot according to an embodiment of the present disclosure.

As best shown in FIGS. 11 and 14, the robot blade 570 extends from the end effector assembly. The robot blade 570 has a top surface 580 and a bottom surface (not shown) defining a thickness. The robot blade 570 comprises a proximal portion 572 having a proximal end 574 attached to the end effector assembly and a distal portion 576 having a distal end 578. The distal portion 576 defines a region where a reticle or substrate 616 is seated. In some embodiments, the distal portion 576 comprises a plurality of ribs 582 extending along the distal portion 576. In some embodiments, the distal portion 576 has a notch 584. As best shown in FIG. 14, the notch 584 has a peak 586 located a distance D1 from the distal end 578. In some embodiments, the distance D1 of the peak 586 is greater than 12 inches.

Figure 13A:
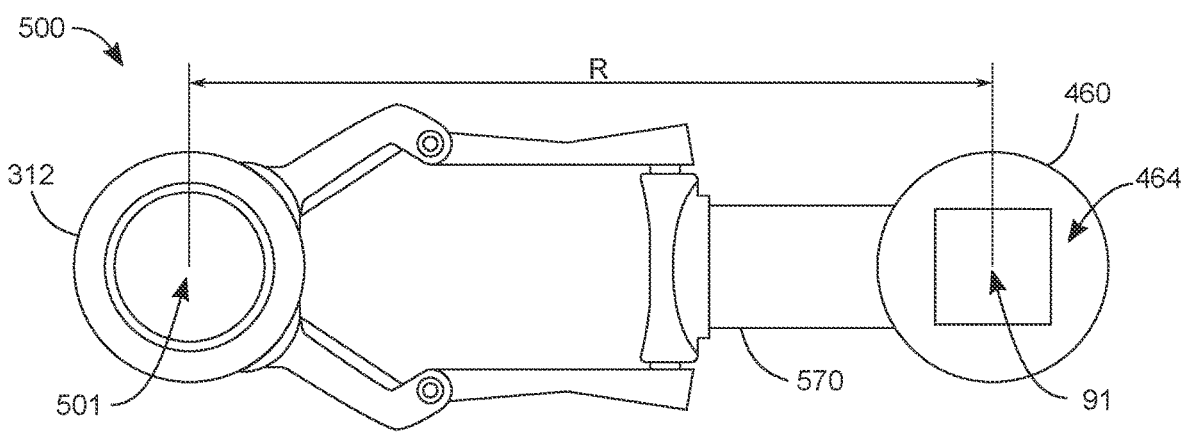
FIGS. 13A and 13B illustrate top views of a central robot used with a substrate processing platform according to an embodiment of the present disclosure.
Figure 13B:
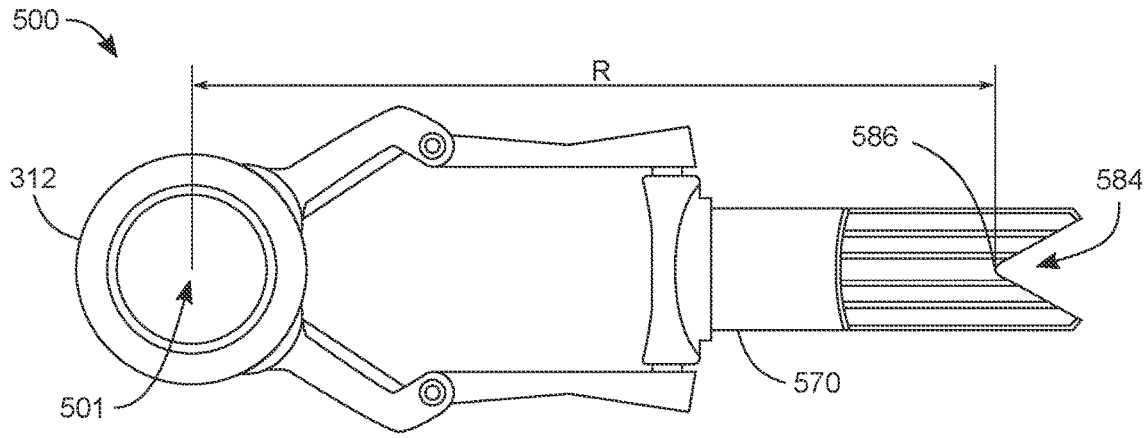

FIG. 11 illustrates the central robot 500 in a fully retracted position. FIG. 13A illustrates the central robot in a fully extended position, the central robot 500 having a reticle or substrate 616 seated on the peak 586 of notch 584 of the robot blade 570. FIG. 13B illustrates the central robot in the fully extended position. A reach R of the central robot 500 is defined by the distance between the common center axis 501 of the central robot hub 312 and the peak 586 of the notch 584, the reach extending in the x-y plane. Where a reticle or substrate 616 is seated on the peak 586, a center axis 91 of the reticle or substrate 616 is positioned over the peak 586.

In some embodiments, the maximum reach R of the central robot 500 in the fully extended position is greater than 39 inches. In some embodiments, the minimum reach R of the central robot 500 in the fully retracted position is 12 inches.

A sweep diameter of the central robot 500 is defined by the common center axis 501 of the central robot hub 312 to the furthest point of the central robot 500 when the central robot 500 is in the fully retracted position. As shown in FIG. 11, in the present embodiment, due to the length of the robot blade 570, the furthest point is from the common center axis 501 of the central robot hub 312 to the distal end 578 of the robot blade 570. In the present embodiment, the sweep diameter is less than 37.4 inches. In some embodiments with a shorter robot blade 570, the furthest point is from the common center axis 501 to the distal ends 526, 516 of the first and second arms 512, 522.

FIG. 15 illustrates a cross-sectional view of the robot blade 570 having a reticle or substrate 616 seated on the robot blade 570, the robot blade 570 partially inserted into one of the plurality of ports 380 of the central transfer chamber 310. Due to the weight of the reticle or substrate 616 being at 1 kg and due to the maximum reach of the central robot 500 in the fully extended position is greater than 39 inches, droop of the central robot 500 in the z-x plane can affect the passage of the robot blade 570 inserted into one of the plurality of ports 380 of the central transfer chamber 310.

In some embodiments, the distal end 578 of the robot blade 570 deflects by less than 0.1975 inches in the z-direction relative to the common central axis 501 of the central robot hub 312 over the maximum reach of the fully extended central robot 500 while the central robot 500 is under a load of 1 kg. A droop ratio of the central robot 500 is defined by deflection of the distal end 578 in the z-direction relative to the common central axis 501 of the central robot hub 312 over a maximum reach of the fully extended central robot 500, the central robot 500 under a load of 1 kg. In some embodiments, the droop ratio is 0.005.

In some embodiments, the base end effector (not shown) deflects by less than 0.0165 inches relative to the common central axis 501 of the central robot hub 312 over a maximum reach of the fully extended central robot 500, the central robot 500 under a load of 1 kg.

According to one or more embodiments, a central robot 500 is provided with a robot arm and blade designed for minimum deflection and longer reach. The robot arm linkage is designed to support the blade which carries loads of about one kilogram. The new robot arm linkage is designed so that fewer particles are generated in use and reduced droop. A motion profile, in particular acceleration and de-acceleration of the robot is tuned such that the motion of the assembly has less vibration and generates less particles.

With the design of new linkage and tuning with new motion profile, the modified robot is capable of handling higher payload and longer reach with minimum particle generation and droop. Handling of heavier EUV mask blank substrates and carrier assemblies with low particle generation during transfer of the EUV mask blank substrates is beneficial for EUV mask blank manufacturing.

In some embodiments, the controller 351 is configured to execute instructions to cause the substrate processing platform to load a substrate from the factory interface, to a first load lock chamber and to a first multi-cathode PVD chamber, deposit a layer on a front side of the substrate, remove the substrate from the first multi-cathode PVD chamber and load the substrate in one of the first load lock chamber and the second load lock chamber and then transfer the substrate back to the factory interface, rotate the substrate 180 degrees to provide a rotated substrate, transfer the rotated substrate to one of the first load lock chamber and the second load lock chamber, load the rotated substrate to one of a first multi-cathode PVD chamber, a second multi-cathode PVD chamber and single cathode PVD chamber and deposit a layer on the back side of the rotated substrate There may be a single controller 351 as shown or multiple controllers. When there is more than one controller, each of the controllers is in communication with each of the other controllers to control of the overall functions of the substrate processing system or platform 300. For example, when multiple controllers are utilized, a primary control processor is coupled to and in communication with each of the other controllers to control the system. The controller is one of any form of general-purpose computer processor, microcontroller, microprocessor, etc., that can be used in an industrial setting for controlling various chambers and sub-processors. As used herein, "in communication" means that the controller can send and receive signals via a hard-wired communication line or wirelessly.

Each controller can comprise processor, a memory coupled to the processor, input/output devices coupled to the processor, and support circuits to provide communication between the different electronic components. The memory includes one or more of transitory memory (e.g., random access memory) and non-transitory memory (e.g., storage) and the memory of the processor may be one or more of readily available memory such as random access memory (RAM), read-only memory (ROM), floppy disk, hard disk, or any other form of digital storage, local or remote. The memory 394 can retain an instruction set that is operable by the processor 392 to control parameters and components of the system. The support circuits are coupled to the processor for supporting the processor in a conventional manner. Circuits may include, for example, cache, power supplies, clock circuits, input/output circuitry, subsystems, and the like.

The methods described herein may generally be stored in the memory as a software routine that, when executed by the processor, causes the process chamber to perform processes of the present disclosure. The software routine may also be stored and/or executed by a second processor that is remotely located from the hardware being controlled by the processor. In one or more embodiments, some or all of the methods of the present disclosure are controlled hardware. As such, in some embodiments, the processes are implemented by software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 351 is configured to control the factory interface 302, the processing chambers 362, 364, 366, 368, 370 and rotation of the central robot 500 positioned within the central transfer chamber 310 and.

Figure 16:
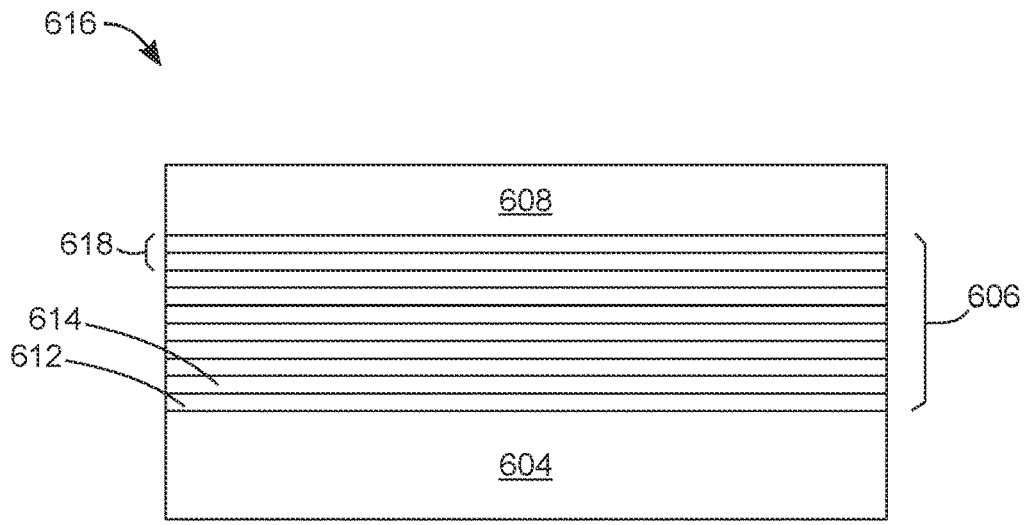
FIG. 16 illustrates a side view of an EUV mask blank according to an embodiment of the present disclosure.

Referring to FIG. 16, an embodiment of an extreme ultraviolet reflective element 602 is shown. In one or more embodiments, the extreme ultraviolet reflective element 602 is an EUV mask blank or an EUV mirror. The EUV mask blank and the EUV mirror are structures for reflecting the extreme ultraviolet light 112 of FIG. 1.

The extreme ultraviolet reflective element 602 includes a substrate 604, a reflective multilayer stack 606 of reflective layers, and a capping layer 608. The reflective multilayer stack 606 reflects EUV radiation, for example at a wavelength of 13.5 nm. In one or more embodiments, the extreme ultraviolet mirror is used to form reflecting structures for use in the condenser 104 of FIG. 1 or the optical reduction assembly 108 of FIG. 1.

The extreme ultraviolet reflective element 602, which in some embodiments is an EUV mask blank, includes the substrate 604, the reflective multilayer stack 606 of reflective layers comprising alternating layers of silicon and molybdenum, and an optional capping layer 608. The extreme ultraviolet reflective element 602 in some embodiments is a EUV mask blank, which is used to form the reflective mask 106 of FIG. 1 by patterning. In the following sections, the term for the EUV mask blank is used interchangeably with the term of the extreme ultraviolet mirror for simplicity.

The EUV mask blank is an optically flat structure used for forming the reflective mask 106 having the mask pattern 114. In one or more embodiments, the reflective surface of the EUV mask blank forms a flat focal plane for reflecting the incident light, such as the extreme ultraviolet light 112 of FIG. 1.

The substrate 604 is an element for providing structural support to the extreme ultraviolet reflective element 602. In one or more embodiments, the substrate 604 is made from a material having a low coefficient of thermal expansion (CTE) to provide stability during temperature changes. In one or more embodiments, the substrate 604 has properties such as stability against mechanical cycling, thermal cycling, crystal formation, or a combination thereof. The substrate 604 according to one or more embodiments is formed from a material such as silicon, glass, oxides, ceramics, glass ceramics, or a combination thereof.

The reflective multilayer stack 606 is a structure that is reflective to the extreme ultraviolet light 112. The reflective multilayer stack 606 includes alternating reflective layers of a first reflective layer 612 and a second reflective layer 614. The first reflective layer 612 and the second reflective layer 614 form a reflective pair 618. In a non-limiting embodiment, the multilayer stack 606 includes a range of 20-60 of the reflective pairs 618 for a total of up to 120 reflective layers.

The first reflective layer 612 and the second reflective layer 614 according to one or more embodiments are formed from a variety of materials. In an embodiment, the first reflective layer 612 and the second reflective layer 614 are formed from silicon and molybdenum, respectively. The first reflective layer 612 and the second reflective layer 614 of some embodiments have a variety of structures. In an embodiment, both the first reflective layer 612 and the second reflective layer 614 are formed with a single layer, multiple layers, a divided layer structure, non-uniform structures, or a combination thereof. Because most materials absorb light at extreme ultraviolet wavelengths, the optical elements used are reflective instead of the transmissive, as used in other lithography systems. The reflective multilayer stack 606 forms a reflective structure by having alternating thin layers of materials with different optical properties to create a Bragg reflector or mirror.

The reflective multilayer stack 606 according to one or more embodiments is formed in a variety of ways. In an embodiment, the first reflective layer 612 and the second reflective layer 614 are formed with magnetron sputtering, ion sputtering systems, pulsed laser deposition, cathode arc deposition, or a combination thereof.

In an illustrative embodiment, the reflective multilayer stack 606 is formed using a physical vapor deposition technique, such as magnetron sputtering. In an embodiment, the first reflective layer 612 and the second reflective layer 614 of the reflective multilayer stack 606 have the characteristics of being formed by the magnetron sputtering technique including precise thickness, low roughness, and clean interfaces between the layers. In an embodiment, the first reflective layer 612 and the second reflective layer 614 of the reflective multilayer stack 606 have the characteristics of being formed by the physical vapor deposition including precise thickness, low roughness, and clean interfaces between the layers.

The physical dimensions of the layers of the reflective multilayer stack 606 formed using the physical vapor deposition technique is precisely controlled to increase reflectivity. In an embodiment, the first reflective layer 612, such as a layer of silicon, has a thickness of 4.1 nm. The second reflective layer 614, such as a layer of molybdenum, has a thickness of 2.8 nm. The thickness of the layers dictates the peak reflectivity wavelength of the extreme ultraviolet reflective element. If the thickness of the layers is incorrect, the reflectivity at the desired wavelength 13.5 nm of some embodiments reduced.

In one or more embodiments, the capping layer 608 is a protective layer allowing the transmission of the extreme ultraviolet light 112. In an embodiment, the capping layer 608 is formed directly on the reflective multilayer stack 606. In one or more embodiments, the capping layer 608 protects the reflective multilayer stack 606 from contaminants and mechanical damage. In one embodiment, the reflective multilayer stack 606 is sensitive to contamination by oxygen, carbon, hydrocarbons, or a combination thereof. The capping layer 608 according to an embodiment interacts with the contaminants to neutralize them.

Figure 17:
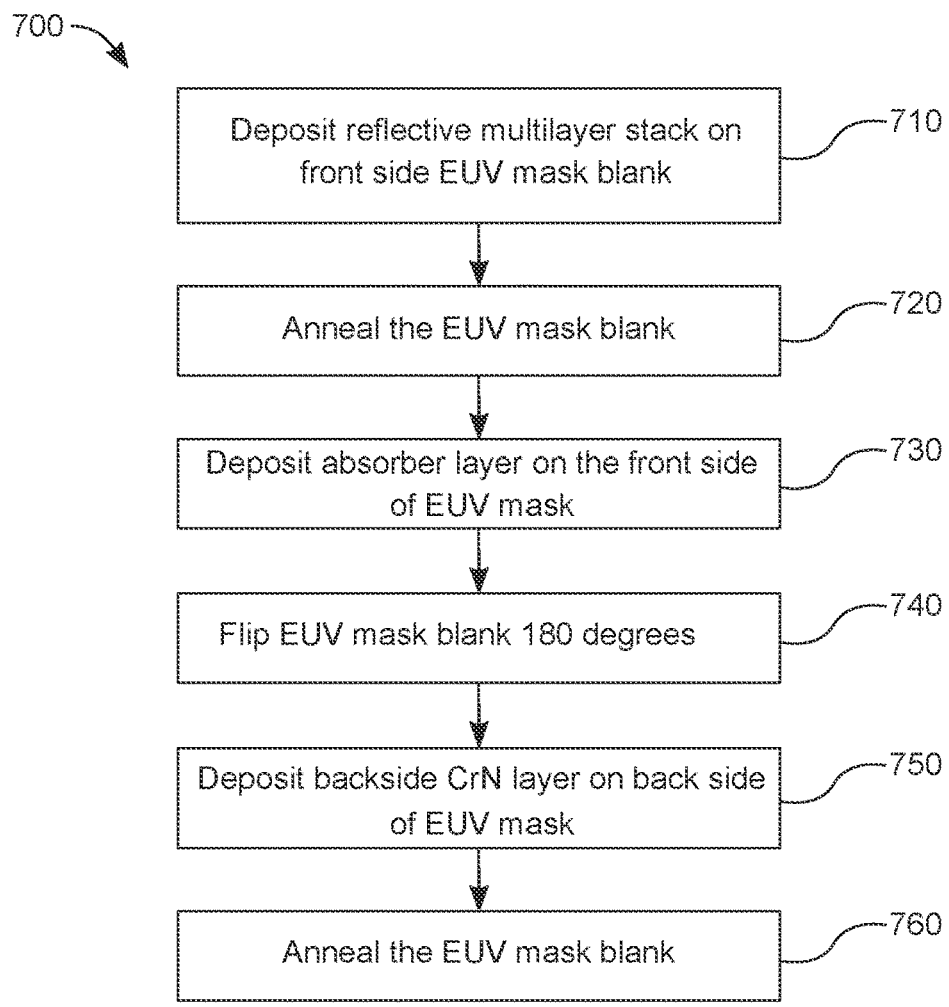
FIG. 17 is a flowchart illustrating a method according to an embodiment of the present disclosure.

Referring now to FIG. 17, a method 700 is shown. In one or more embodiments, a method 700 of processing an EUV mask blank substrate in a substrate processing platform comprises at 710 depositing a reflective multilayer stack on a front side of an EUV mask blank substrate. At 720, the EUV mask blank is annealed. At 730, an absorber layer is deposited on the reflective multilayer stack. Optionally, a capping layer may be deposited on the reflective multilayer stack prior to depositing the absorber layer. At 740, the EUV mask blank is rotated or flipped 180 degrees. After flipping the substrate, at 750 a backside layer, e.g., CrN, is deposited on the backside of the EUV mask blank. The EUV mask blank may be annealed at 760.

Figure 18:
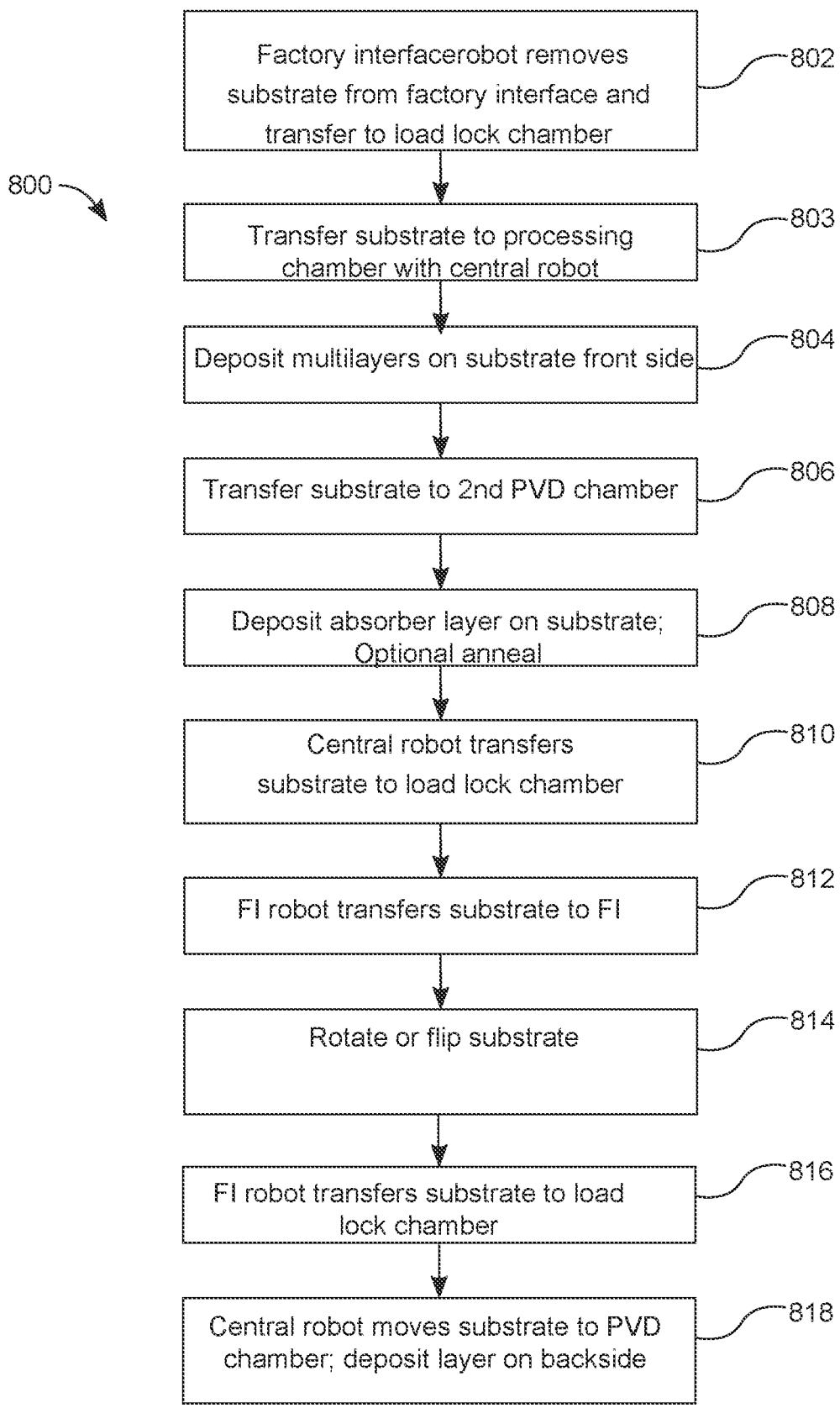
FIG. 18 is a flowchart illustrating a method according to an embodiment of the present disclosure.

FIG. 18 discloses another embodiment of a method 800. At 802, the method involves using a factory interface robot to remove the EUV mask blank substrate from a factory interface and transfer the EUV mask blank substrate to a first load lock chamber. At 803, the method involves using a central robot to transfer the EUV mask blank from the first load lock chamber through a single central transfer chamber and to a first multi-cathode PVD chamber. At 804, the method includes depositing a reflective multilayer stack comprising a plurality of bilayer pairs on a front side of the EUV mask blank substrate in the first multi-cathode PVD chamber. At 806, the central robot is used to transfer the EUV mask blank substrate to a second multi-cathode PVD chamber. At 808, an absorber layer on the front side of the EUV mask blank substrate after depositing the reflective multilayer stack in the second multi-cathode PVD chamber; At 808, the EUV mask blank substrate is annealed in a first substrate annealing chamber.

At 810, the method includes utilizing the central robot to transfer the EUV mask blank substrate to the first load lock chamber or a second load lock chamber. At 812, the method includes utilizing the factory interface robot to transfer the EUV mask blank substrate after annealing from the first load lock chamber or the second load lock chamber back to the factory interface. At 814, the method includes utilizing a substrate flipping fixture positioned in the factory interface to rotate the substrate 180 degrees so that the front side is facing downward. At 816, the method includes utilizing the factory interface robot to transfer the EUV mask blank to the first load lock chamber or the second load lock chamber. At 818, the method includes utilizing the central robot to transfer the EUV mask blank with the front side facing downward and a backside facing upward from the first load lock chamber or the second load lock chamber through the single central transfer chamber and to one of the first multi-cathode PVD chamber, the second multi-cathode PVD chamber and a single cathode PVD chamber and then depositing a backside layer on the back side of the EUV mask blank substrate.

In one or more embodiments of the method, the plurality of bilayer pairs comprises Si and Mo. In one or more embodiments, the absorber layer is deposited on the reflective multilayer stack. In one or more embodiments, the backside layer comprises CrN. The method in some embodiments includes supporting the EUV mask blank substrate a moveable support fixture prior to rotating the substrate 180 degrees. In some embodiments of the method, the substrate flipping fixture further comprises a pair of gripping elements, and the method includes using the pair of gripping elements to grip edges of the substrate between the front side and the back side, moving the moveable support fixture away from the gripping elements, and rotating the gripping arms 180 degrees to cause the front side of the substrate to rotate from a first position in which the front side faces upward to a second position in which the front side faces downward.

Embodiments of the method may include EUV mask blank fixture on a build module fixture mounted adjacent the substrate flipping fixture, the build module fixture configured to support an EUV mask blank carrier assembly including a carrier base and a top shield having an opening therein sized and shaped to receive an EUV mask blank. In one or more embodiments, the method involves the build module fixture further comprising lift pins configured to separate the top shield from the carrier base and using the lift pins to separate the top shield from the carrier base to expose the EUV mask blank substrate Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

The invention claimed is:

1. An EUV mask blank substrate processing platform comprising:
 a plurality of EUV mask blank substrate processing chambers including a single central transfer chamber including a central robot hub having five substrate processing chambers surrounding the single central transfer chamber, the central transfer chamber and the five substrate processing chambers being under vacuum conditions, the five substrate processing chambers comprising at least two multi-cathode physical vapor deposition (PVD) chambers and at least one substrate annealing chamber, and at least a first single cathode PVD chamber;
 a central robot including a central hub and a robot blade having a distal end disposed in the single central transfer chamber, the central robot configured to load and unload the EUV mask blank substrate from the five substrate processing chambers and configured to support a load of 1 kg with a downward deflection of less than 0.1975 inches when the distal end is extended 39.5 inches from the central hub to reduce particle generation;
 a factory interface disposed between the plurality of EUV mask blank substrate processing chambers and an ambient factory environment;
 a substrate flipping fixture disposed within the factory interface and configured to rotate the EUV mask blank substrate having a front side and a back side 180 degrees such that material can be deposited on both the front side and the back side of the EUV mask blank substrate in one of the five substrate processing chambers;
 a factory interface robot configured to load substrates from the ambient factory environment into the factory interface and onto the EUV mask blank substrate flipping fixture; and
 a build module fixture mounted adjacent the EUV mask blank substrate flipping fixture, the build module fixture configured to support an EUV mask blank carrier assembly including a carrier base and a top shield having an opening therein sized and shaped to receive an EUV mask blank and lift pins configured to separate the top shield from the carrier base, the EUV substrate processing platform configured to perform all deposition and annealing steps to process the EUV mask blank without transferring the EUV mask blank substrate outside the EUV mask blank substrate processing platform.

2. The EUV mask blank substrate processing platform of claim 1, further comprising a first load lock chamber and a second load lock chamber and wherein the factory interface robot is configured to transfer the EUV mask blank substrate between the factory interface and the first load lock chamber and between the factory interface and the second load lock chamber.

3. The EUV mask blank substrate processing platform of claim 2, further comprising a controller configured to execute instructions to cause the EUV mask blank substrate processing platform to load a substrate from the factory interface, to a first load lock chamber and to a first multi-cathode PVD chamber, deposit a layer on a front side of the EUV mask blank substrate, remove the EUV mask blank substrate from the first multi-cathode PVD chamber and load the EUV mask blank substrate in one of the first load lock chamber and the second load lock chamber and then transfer the EUV mask blank substrate back to the factory interface, rotate the EUV mask blank substrate 180 degrees to provide a rotated substrate, transfer the rotated substrate to one of the first load lock chamber and the second load lock chamber, load the rotated substrate to a second multi-cathode PVD chamber and deposit a layer on the back side of the rotated substrate.

4. The EUV mask blank substrate processing platform of claim 2, wherein each of the at least one substrate annealing chamber and each of the at least one multi-cathode PVD chambers comprise a vertical slit valve having a vertical opening and a door, the door configured to travel in a perpendicular direction relative to the vertical opening.

5. The EUV mask blank substrate processing platform of claim 2, wherein the at least one substrate annealing chamber is a multi-substrate annealing chamber configured to anneal one or more substrates.

6. The EUV mask blank substrate processing platform of claim 2, further comprising a second multi-cathode PVD chamber configured to deposit different material layers.

7. The EUV mask blank substrate processing platform of claim 2, further comprising a third multi-cathode PVD chamber configured to deposit different material layers.

8. The EUV mask blank substrate processing platform of claim 6 further comprising a second substrate annealing chamber adjacent to a second multi-cathode PVD chamber, the second substrate annealing chamber in communication with the central transfer chamber.

9. The EUV mask blank substrate processing platform of claim 2, the EUV mask blank substrate flipping fixture comprises a moveable support fixture to support a substrate during substrate flipping process.

10. The EUV mask blank substrate processing platform of claim 9, the EUV mask blank substrate flipping fixture further comprising a pair of gripping elements configured to grip edges of the EUV mask blank substrate between the front side and the back side, the gripping elements configured to rotate 180 degrees to cause the front side of the EUV mask blank substrate to rotate from a first position in which the front side faces upward to a second position in which the front side faces downward.

* * * * *